United States Patent
Gupta et al.

(10) Patent No.: US 7,015,842 B1
(45) Date of Patent: Mar. 21, 2006

(54) HIGH-SPEED SAMPLING ARCHITECTURES

(75) Inventors: Sandeep Kumar Gupta, Santa Clara, CA (US); Oleksiy Zabroda, San Jose, CA (US)

(73) Assignee: Teranetics, Inc., Santa Clara, CA (US)

( * ) Notice: Subject to any disclaimer, the term of this patent is extended or adjusted under 35 U.S.C. 154(b) by 0 days.

(21) Appl. No.: 11/033,661

(22) Filed: Jan. 12, 2005

(51) Int. Cl.
*H03M 1/00* (2006.01)

(52) U.S. Cl. .................................... 341/122; 341/123
(58) Field of Classification Search ................ 341/122
See application file for complete search history.

(56) References Cited

U.S. PATENT DOCUMENTS

| | | | | |
|---|---|---|---|---|
| 5,218,363 | A * | 6/1993 | LeCroy et al. | 341/123 |
| 6,362,755 | B1 * | 3/2002 | Tinker | 341/61 |
| 6,420,981 | B1 * | 7/2002 | Yu | 341/100 |
| 6,518,907 | B1 * | 2/2003 | Tsai | 341/155 |
| 6,570,410 | B1 | 5/2003 | Manganaro | |
| 6,608,575 | B1 * | 8/2003 | Bazarjani | 341/143 |
| 6,937,174 | B1 * | 8/2005 | Higashi et al. | 341/122 |

OTHER PUBLICATIONS

K. El-Sankary, A. Assi, and M. Sawan, A New Time-Interleaved Architecture for High-Speed A/D Converters, International Workshop on Digital and Computational Video, Nov. 2002.

Gabriele Manganaro, An Improved Phase Clock Generator for Interleaved and Double-Sampled Switched-Capacitor Circuits, 2001 IEEE, no month.

* cited by examiner

*Primary Examiner*—Linh Van Nguyen
(74) *Attorney, Agent, or Firm*—Brian R. Short

(57) ABSTRACT

A high-speed sampling system and an analog to digital converter are disclosed. One embodiment of a method of sampling a signal includes receiving an analog signal and generating first samples at a rate of Fs, and generating second sub-samples from the first samples at a rate of Fs/N and having a relative phase of approximately $(360/N)*(i-1)$ degrees, where i varies from 1 to N. In a first embodiment, at most two second sub-samplers are tracking the output of the first sampler at any point in time. In a second embodiment, only one of the N second sub-samplers are tracking the output of the first sampler at any point in time. A third embodiment further includes generating third samples from the second samples at a rate of Fs/N, and having a relative phase of approximately $((360/N)*(i-1)+180)$ degrees. A method of interleaved analog to digital converting includes corresponding time interleaved ADCs receiving the third samples.

41 Claims, 21 Drawing Sheets

```
┌─────────────────────────────────────┐
│   RECEIVING AN ANALOG SIGNAL AND    │
│  GENERATING FIRST SAMPLES AT A RATE │
│                 OF                  │
│                 FS                  │
│                                     │
│                 310                 │
└─────────────────────────────────────┘
                  │
                  ▼
┌─────────────────────────────────────┐
│   GENERATING SECOND SAMPLES FROM    │
│   THE FIRST SAMPLES AT A RATE OF    │
│   FS/N, THE SECOND SAMPLES HAVING   │
│   A RELATIVE PHASE OF (360/N)*(I-1) │
│   DEGREES, WHERE I VARIES FROM 1    │
│                TO N                 │
│                                     │
│                 320                 │
└─────────────────────────────────────┘
                  │
                  ▼
┌─────────────────────────────────────┐
│   GENERATING THIRD SAMPLES FROM THE │
│   SECOND SAMPLES AT A RATE OF FS/N, │
│   AND HAVING A RELATIVE PHASE OF    │
│   APPROXIMATELY ((360/N)*(I-1)+180) │
│               DEGREES               │
│                                     │
│                 330                 │
└─────────────────────────────────────┘
```

FIGURE 3A

HIGH-SPEED SAMPLING ARCHITECTURES

FIELD OF THE INVENTION

The invention relates generally to electronics. More particularly, the invention relates to high-speed sampling circuits, and analog to digital converter (ADC) architectures.

BACKGROUND OF THE INVENTION

High-speed networks are continually evolving. The evolution includes a continuing advancement in the operational speed of the networks. The network implementation of choice that has emerged is Ethernet networks physically connected over twisted pair wiring. One of the most prevalent high speed LANs (local area network) for providing connectivity between personal computers, workstations and servers is Ethernet in its 10BASE-T form.

High-speed LAN technologies include 100BASE-T (Fast Ethernet) and 1000BASE-T (Gigabit Ethernet). Fast Ethernet technology has provided a smooth evolution from the 10 megabits per second (Mbps) performance of 10BASE-T to the 100 Mbps performance of 100BASE-T. Gigabit Ethernet provides 1 Gigabit per second (Gbps) data rate with essentially the simplicity of Ethernet. There is a desire to push operating performance to even greater data rates.

Increases in the speeds of communication networks require increases in the speeds of ADCs used in the communication networks. A time-interleaved ADC architecture can effectively provide high-speed analog to digital conversion with ADCs that individually operate at much lower frequencies than the analog to digital conversion. Therefore, a time-interleaved ADC architecture can be used to increase the effective operational frequency of the ADCs.

FIG. 1 shows a time interleaved analog to digital converter architecture. A plurality of N sub-sample, sample and hold circuits 110, 112, 114 receive an analog signal. Clocks to each of the sample and hold circuits operate at a frequency of Fs/N, and include a phase of approximately $(360/N)*(i-1)$, in which i varies from 1 to N. Each of the sample and hold circuits sample the incoming analog signal at calculated moments in time. The samples are input to corresponding M-bit ADCs 120, 122, 124. The ADCs 120, 122, 124 also include clocks that operate at a frequency of Fs/N, and include a phase of approximately $(360/N)*(i-1)$. The delayed phase relationships of the clock signals result in digital samples from the ADCs which occur at a frequency of Fs. The result is an effective sampling frequency of Fs. N is the number of time interleaved ADCs and T is the period of the effective sampling frequency Fs.

The time interleaved architecture of FIG. 1 is fully sub-sampled (that is, sub-samples are generated by each of N sample and hold circuits, and processed by ADCs). Time interleaved architectures are useful for applications in which the desired sampling frequency Fs is higher than available individual ADCs or sample and hold circuits can operate. Each individual ADC and sample and hold circuit must only operate at a clock frequency of Fs/N.

The time interleaved ADC architecture of FIG. 1, however, has several limitations. For example, this time interleaved ADC architecture can suffer from gain errors, offset errors and phase timing errors, resulting in degradation of the signal to noise (SNR) of the combined sub-sample signals.

FIG. 2 shows another embodiment of a time interleaved analog to digital converter architecture. This embodiment includes a Nyquist rate sample and hold circuit 210, which generates samples for the N M-bit, sub-sample ADCs 220, 222, 224. The up-front sample and hold circuit can effectively eliminate the phase timing errors by holding the sampled analog signal at a rate of Fs. The sampled signal is static before being sub-sampled. Essentially, the sample and hold circuit 210 "slows down" the changes of the analog signal. As long as the sub-samples are made during the static (sampled) periods of the output of the sample and hold circuit 210, the phase timing errors can be eliminated.

Though the embodiment of FIG. 2 may reduce phase timing errors when compared to the embodiment of FIG. 1, this embodiment has some limitations. First, the sample and hold circuit of FIG. 2 receives a high-frequency analog signal, and is required to process samples internally at a full rate of Fs. Second, output of the sample and hold circuit is stable (or slow moving) for only a period of time of 1/Fs. Therefore, the processing of the ADCs 220, 222, 224 is still difficult.

It is desirable to have a method and apparatus for high-speed sampling and holding of an analog signal. It is desirable that the method and apparatus be adaptable for use with time interleaved ADCs, and eliminate the disadvantages described above.

SUMMARY OF THE INVENTION

The invention includes an apparatus and method for a sampling and holding a signal, and is adaptable for use with a time interleaved ADC system.

A first embodiment includes a method of sampling a signal. The method includes receiving an analog signal and generating first samples of the signal at a rate of Fs, generating second samples from the first samples at a rate of Fs/N, the second samples having a relative phase of approximately $(360/N)*(i-1)$ degrees, where i varies from 1 to N, and generating third samples from the second samples at a rate of Fs/N, and having a relative phase of approximately $((360/N)*(i-1)+180)$ degrees.

A second embodiment includes another method of sampling a signal. The method includes a first sampler receiving an analog signal and generating first samples at a rate of Fs, second samplers generating second sub-samples from the first samples at a rate of Fs/N and having a relative phase of approximately $(360/N)*(i-1)$ degrees, where i varies from 1 to N, wherein at most two second samplers are tracking the output of the first sampler at any point of time. Another embodiment includes at most one of the N second samplers tracking the output of the first sampler at any point in time.

Another embodiment includes a sampling circuit. The sampling circuit includes a first sampler receiving an analog signal and generating first samples at a rate of Fs. The sampling circuit further includes a plurality of N second samplers, each of the second samplers receiving the output of the first sampler, an ith second sampler generating second sub-samples at a rate of Fs/N and having a phase of approximately $(360/N)*(i-1)$ degrees, where i varies from 1 to N. The sampling circuit further includes a plurality of N third samplers, each of the third samplers processing the output of the second sampler, an ith third sampler generating third sub-samples at a rate of Fs/N and having a phase of approximately $((360/N)*(i-1)+180)$ degrees.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIGS. 3A, 3B and 3C are flow charts showing embodiments of methods of high speed sampling.

DETAILED DESCRIPTION

Figure 3B:
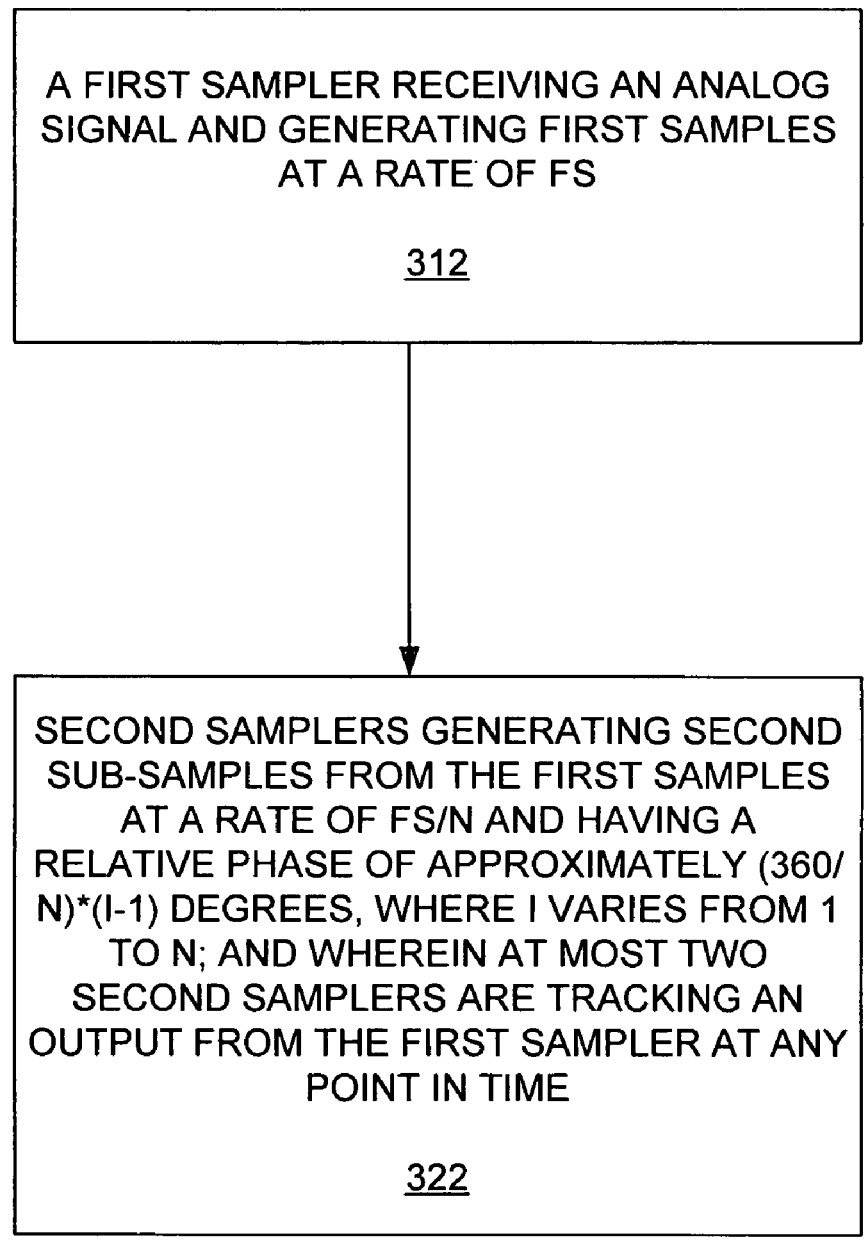
Figure 3C:
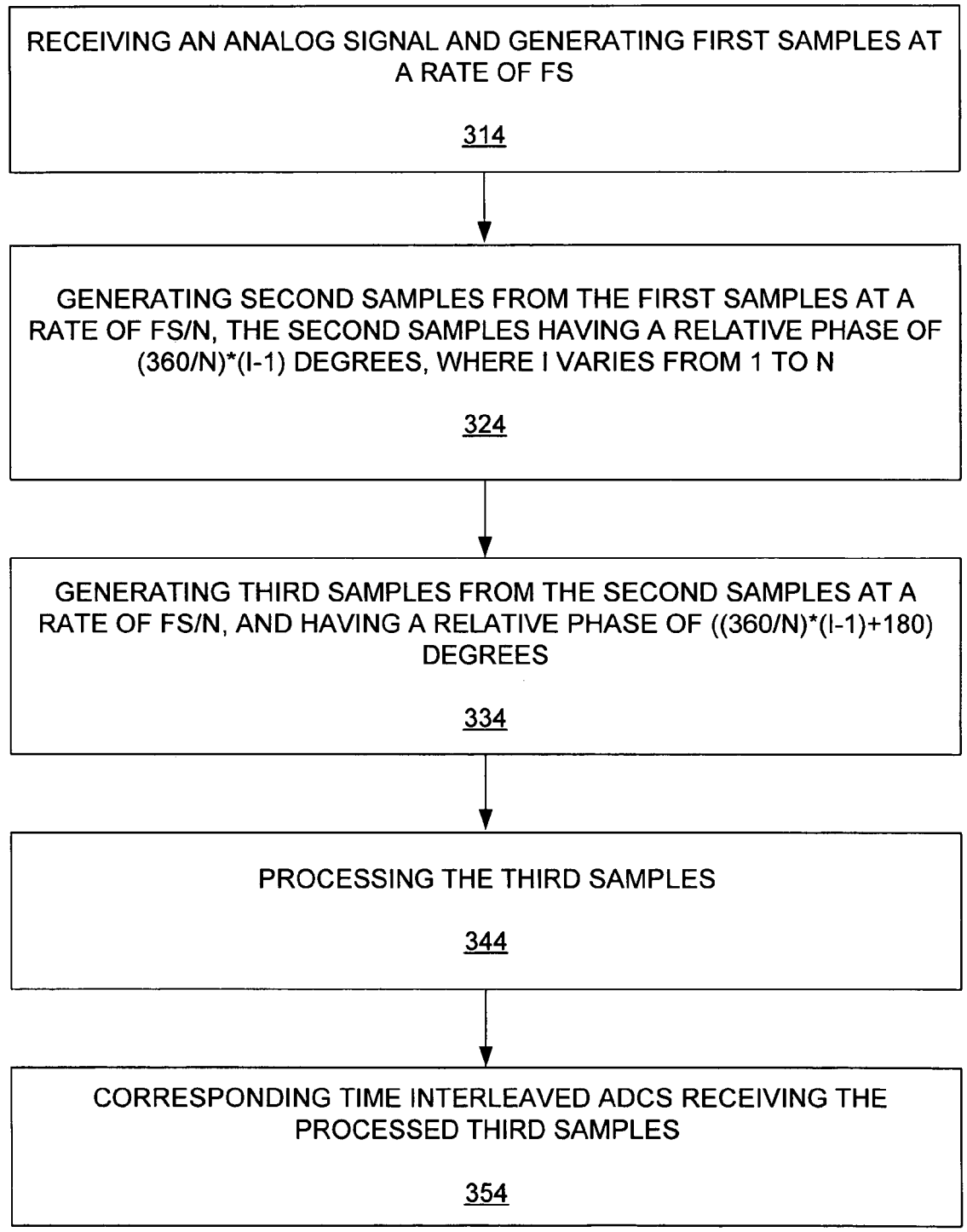
Figure 4A:
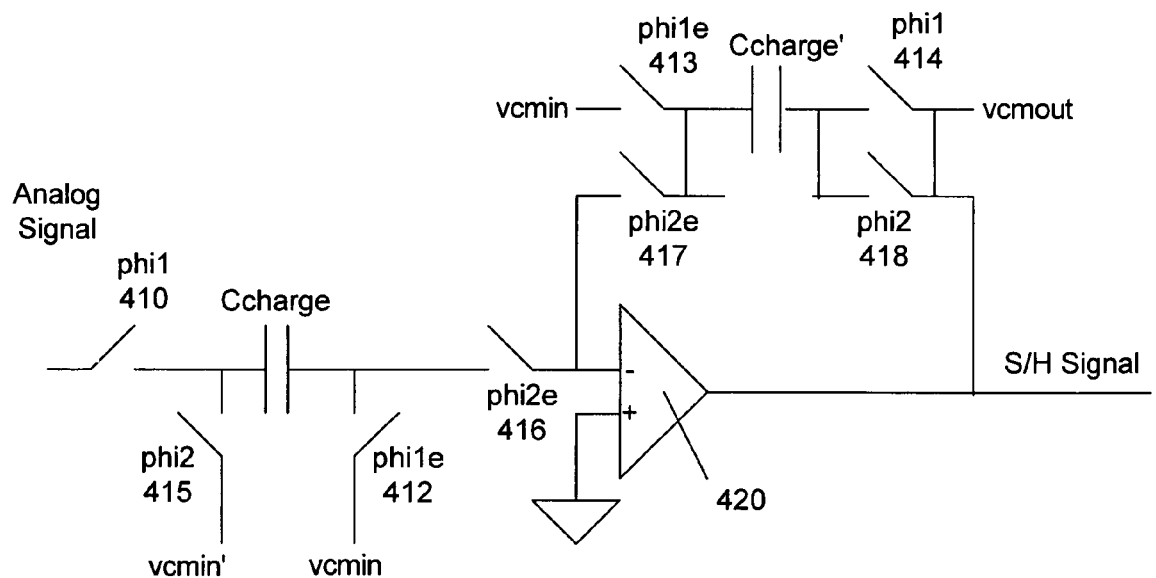
FIGS. 4A and 4B show a circuit diagram and timing diagram of a switched capacitor S/H circuit that provides differential outputs.
Figure 5:
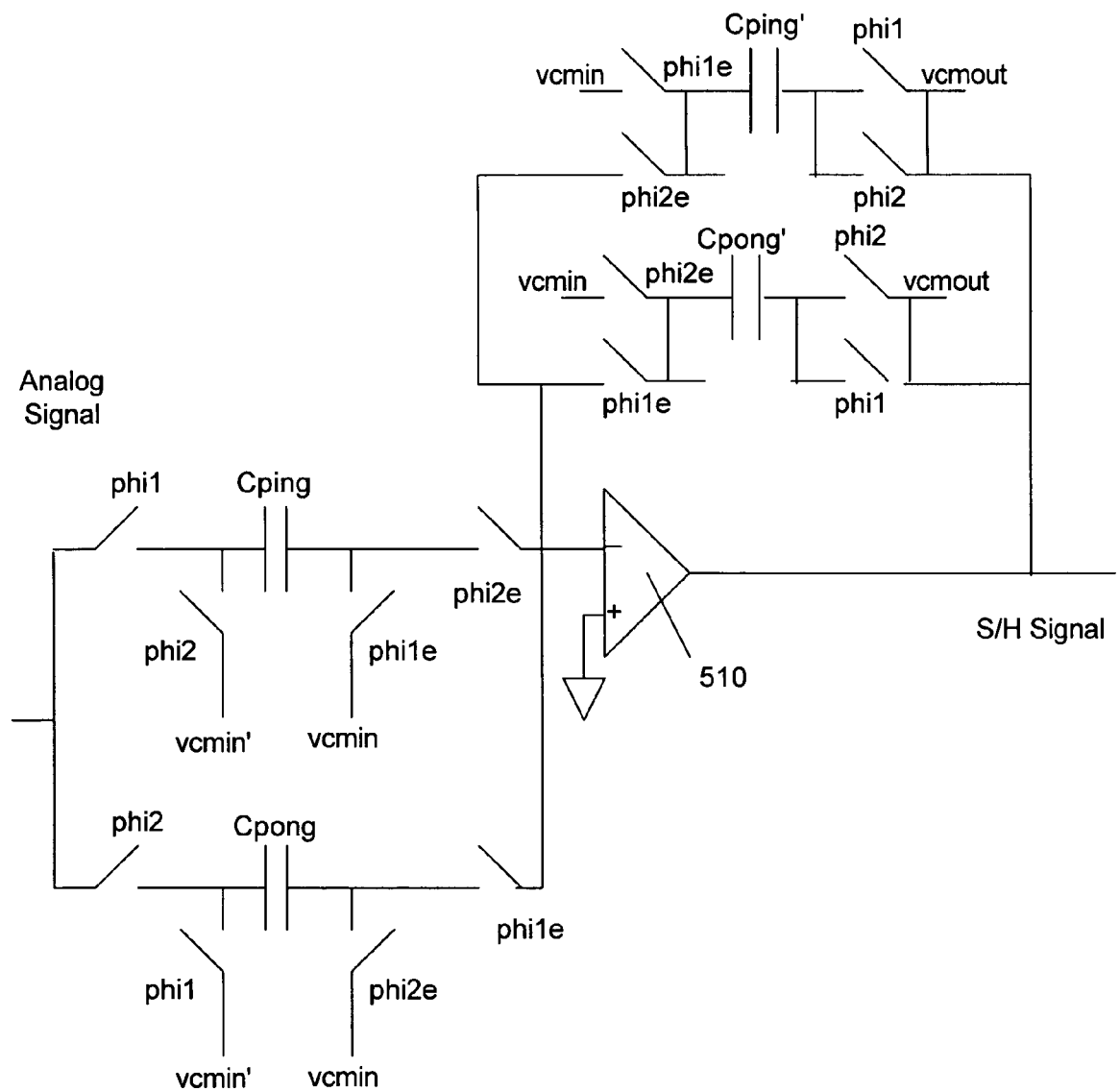
FIG. 5 shows a circuit diagram of a double sampled, switched capacitor differential circuit.
Figure 6:
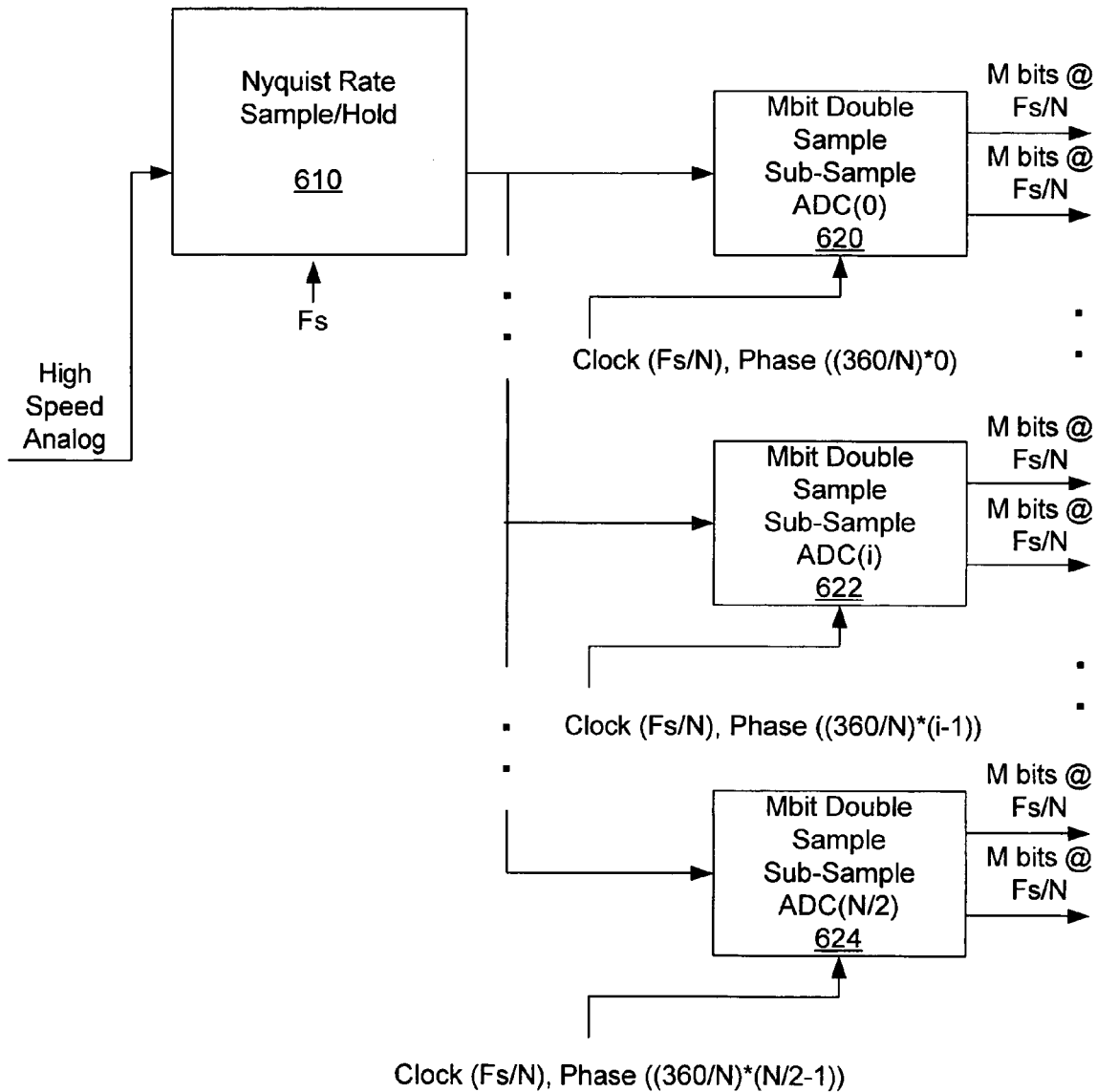
FIG. 6 shows a time interleaved analog to digital converter architecture that includes double sample, sub-sample ADCs.

As shown in the drawings for purposes of illustration, the invention is embodied in an apparatus and method for a high-speed sample and hold circuits, and high-speed ADC architectures. FIGS. 3A, 3B, 3C, show high-level embodiments of methods of sampling a signal, and generating digital samples from the signal. FIGS. 4A, 5, 6 show circuits that can be used in alternate embodiments of the high-speed sampling and ADC architectures. FIGS. 7A, 8, 9, 10A each show embodiments of samplers. These embodiments can employ the methods shown in FIGS. 3A, 3B, 3C. FIGS. 11, 12, 13, 14 show high-speed sampling and time interleaved ADC architectures. FIG. 15 shows general implementation of Ethernet components that can use the embodiments of high-speed sampling and interleaved ADCs.

As stated, FIGS. 3A, 3B, 3C, show high-level embodiments of methods of sampling a signal, and generating samples from the signal. The features and benefits of these methods will become more apparent as the circuits that employ these methods are described in detail.

FIG. 3A is a flow chart that includes steps of another method of sampling a signal. A first step 310 includes receiving an analog signal and generating first samples at a rate of Fs. A second step 320 includes generating second samples from the first samples at a rate of Fs/N, the second samples having a relative phase of $(360/N)*(i-1)$ degrees, where i varies from 1 to N. A third step 330 includes generating third samples from the second samples at a rate of Fs/N, and having a relative phase of approximately $((360/N)*(i-1)+180)$ degrees. The combination of generating first samples at a rate of Fs and generating second and third samples at a rate of Fs/N, results in a sampled and held output being generated at a rate of Fs/N.

FIG. 3B is a flow chart that includes steps of a method of sampling a signal. A first step 312 includes a first sampler receiving an analog signal and generating first samples at a rate of Fs. A second step 322 includes second samplers generating second sub-samples from the first samples at a rate of Fs/N and having a relative phase of approximately $(360/N)*(i-1)$ degrees, where i varies from 1 to N; and wherein at most two second sub-samplers are tracking the output of the first sampler at any point in time. An alternate embodiment include at most one second sub-sampler tracking the output of the first sampler at any given point in time. The combination of generating first samples at a rate of Fs and generating second samples at a rate of Fs/N, results in a track and held output being generated at a rate of Fs/N.

FIG. 3C is a flow chart that includes steps of a method of high-speed interleaved analog to digital converting. A first step 314 includes receiving an analog signal and generating first samples at a rate of Fs. A second step 324 includes generating second samples from the first samples at a rate of Fs/N, the second samples having a relative phase of $(360/N)*(i-1)$ degrees, where i varies from 1 to N. A third step 334 includes generating third samples from the second samples at a rate of Fs/N, and having a relative phase of $((360/N)*(i-1)+180)$ degrees. A fourth step 344 includes processing the third samples. A fifth step 354 includes corresponding time interleaved ADCs receiving the processed third samples.

Switched Capacitor Circuits

Figure 4B:
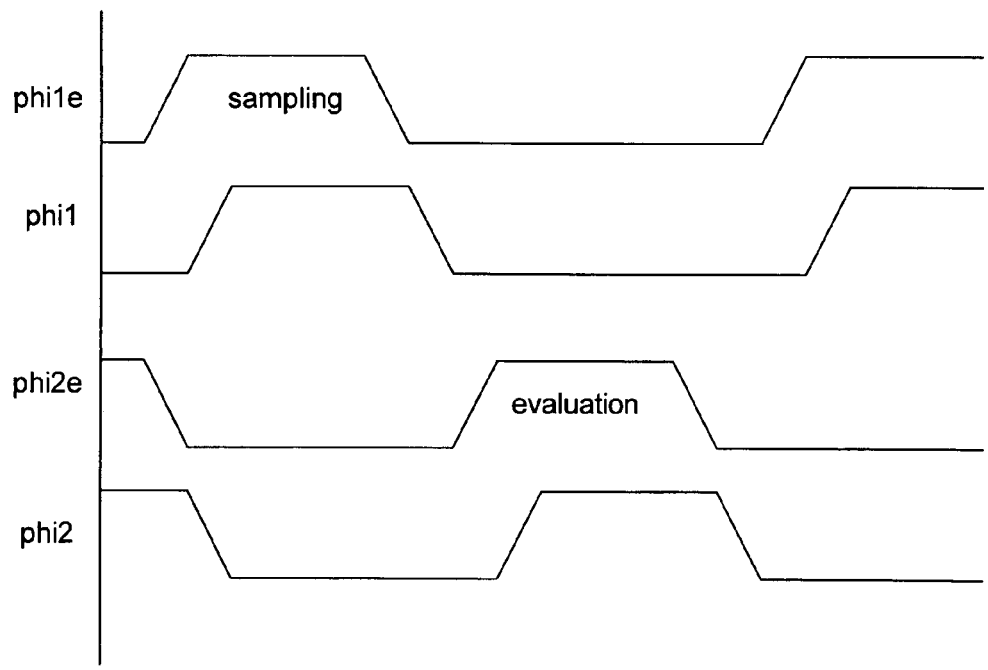

FIGS. 4A and 4B show a circuit diagram and timing diagram of a switched capacitor S/H circuit that provides differential outputs. As will be described, switched capacitor circuits can be adapted for use in circuits that employ the previously described methods of sampling and generating digital samples from an analog signal. A switched capacitor circuit can include a first capacitor that samples (the sampling charges the capacitor) an input signal at one phase of a clock signal (for example, the clock signal being at a high level), and transfers the charge to processing circuitry during a second phase of the clock signal. The processing circuitry can include switched capacitors in feedback of an operational amplifier 420 of the switched capacitor circuit.

FIG. 4A shows a switched capacitor circuit that receives an analog signal and generates a sample and hold (S/H) signal. The analog signal is sampled by closing switches 410, 412 by clock signals signals phi1 and phi1e, causing a charging capacitor (Ccharge) to charge. The charging sequence is reflected in the timing waveforms of the control signals as shown in FIG. 4B, designated as sampling. Switches 413, 414 are also closed, causing a feedback charging capacitor (Ccharge') to be precharged to voltage as determined by two reference voltages, vcmin and vcmout. The voltage vcmout can be kept equal to the common mode voltage of the output of the operational amplifier 420. The voltage vcmin can be set to a voltage so that operation of the switches 412, 416, 413, 417 is fast and accurate. The additional vcmin' voltage is included to illustrate that different supply voltages can be used on either side of the charging capacitor Ccharge. The voltage vcmin' can be set to a voltage (different) which is equal to the input common mode voltage of the input analog signal. Switches 415, 416, 417, 418 are controlled by clock signals phi2 and phi2e, and are open during the sampling phase.

A subsequent phase (evaluation phase, processing) includes the transferring the charge of the charging capacitor to the feedback circuitry. As shown by the timing diagram of FIG. 4B, the clock signals phi1, phi1e are low during this phase, and the clock signals phi2, phi2e are high during this phase.

An undesirable feature of the switch capacitor circuit sampler of FIG. 4A is that the operational amplifier 420 (assuming the operational amplifier is a class A amplifier) only aids in the sampling of the analog signal during the evaluation phase. It would be desirable to more efficiently utilize the operational amplifier because the operational amplifier continually dissipates power during both the sampling phase, and the holding phase.

Double Sampling Circuits

The switched capacitor circuit of FIG. 4A is not optimal because the operational amplifier (again, assuming the operational amplifier is a class A amplifier) is not aiding in the processing while the switched capacitor circuit is charging. That is, the operational amplifier is consuming power, but not providing any useful benefit during the sampling period of the switched capacitor circuit. FIG. 5 shows a circuit diagram of a double sampled, switched capacitor differential circuit. This circuit configuration provides a more efficient use of the operational amplifiers. Therefore, a feature of the double sampling circuits is that half the number of operational amplifier and ADCs (assuming each ADC includes double sampling circuits) are required for a time interleaved ADC system that uses the double sampling circuit. As will be described, double sampled, switched capacitor differential circuits can be adapted for use in circuits that employ the previously described embodiments for sampling and generating digital samples from an analog signal.

The double sampling circuit of FIG. 5 includes two sets of "ping-pong" capacitors (Cping, Cpong). When the "ping" capacitor is sampling (charging), the "pong" capacitor is in an evaluation phase. The evaluation phase typically includes transferring the charge of the corresponding capacitor to the operational amplifier. An opposite phase exits in which the roles of the capacitors are reversed. That is, the pong capacitor is sampling (charging) while the ping capacitor is in the evaluation phase. The ping-pong configuration is useful because it optimizes the operational use of the operational amplifier 510. That is, the operational amplifier 510 which is one of the main power consuming elements of a switched capacitor ADC architecture is used during both cycles of the sampling. The two different phases of the ping-pong architecture are determined by a clock that should have an approximately 50 percent duty cycle.

The clock signals for the double sampling circuit of FIG. 5 are as shown in FIG. 4B. The switched capacitor circuits of the input ping-pong circuit are clocked so that they are out of phase. Additionally, the switched capacitor circuits located at the feedback of the operational amplifier 510 are also clocked so that they are out of phase. Charging capacitors Cping are discharging while the charging capacitors Cpong are charging, and the charging capacitors Cpong are discharging while the charging capacitors Cping are charging.

Figure 1:
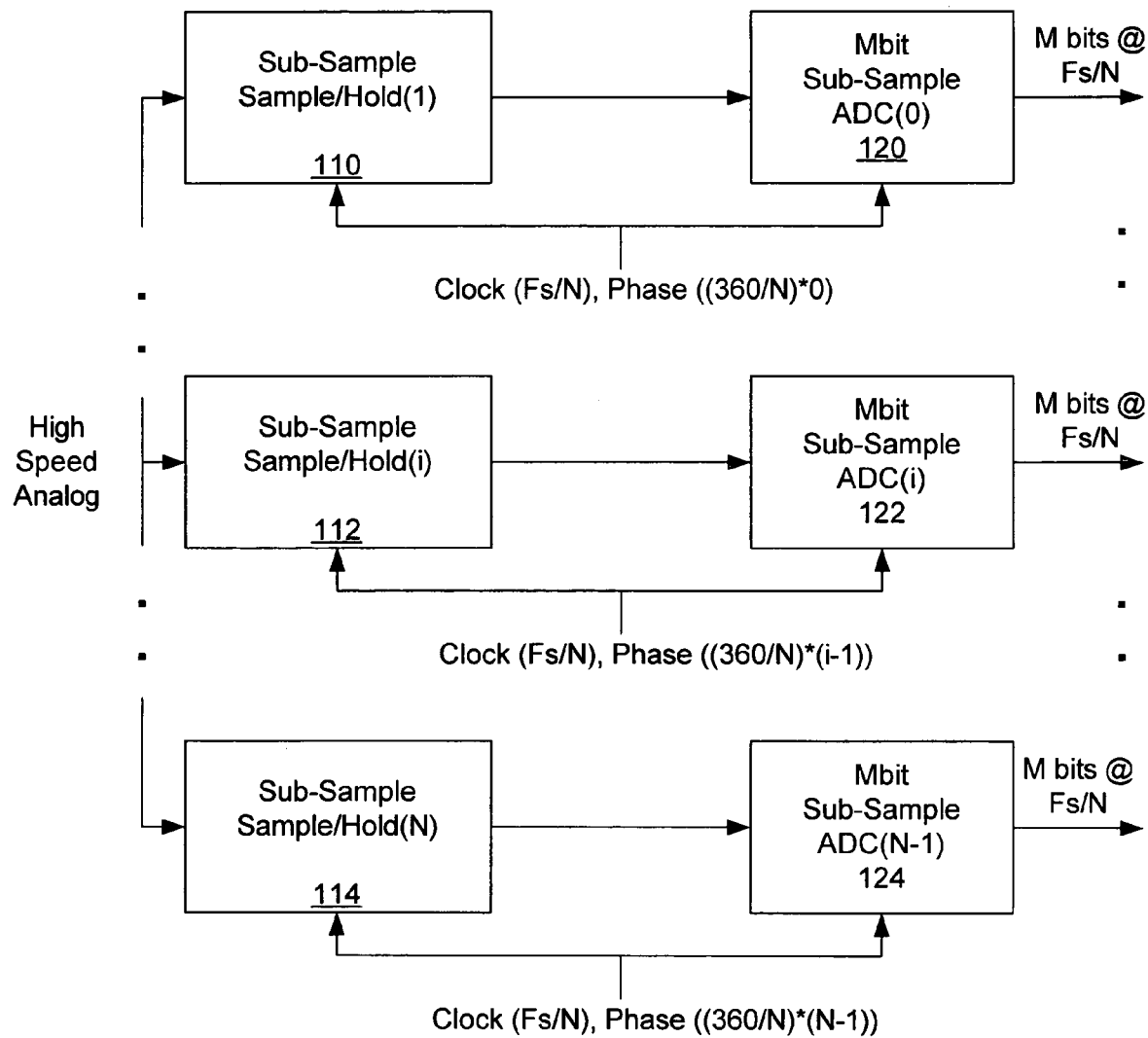
FIG. 1 shows a time interleaved analog to digital converter architecture.
Figure 2:
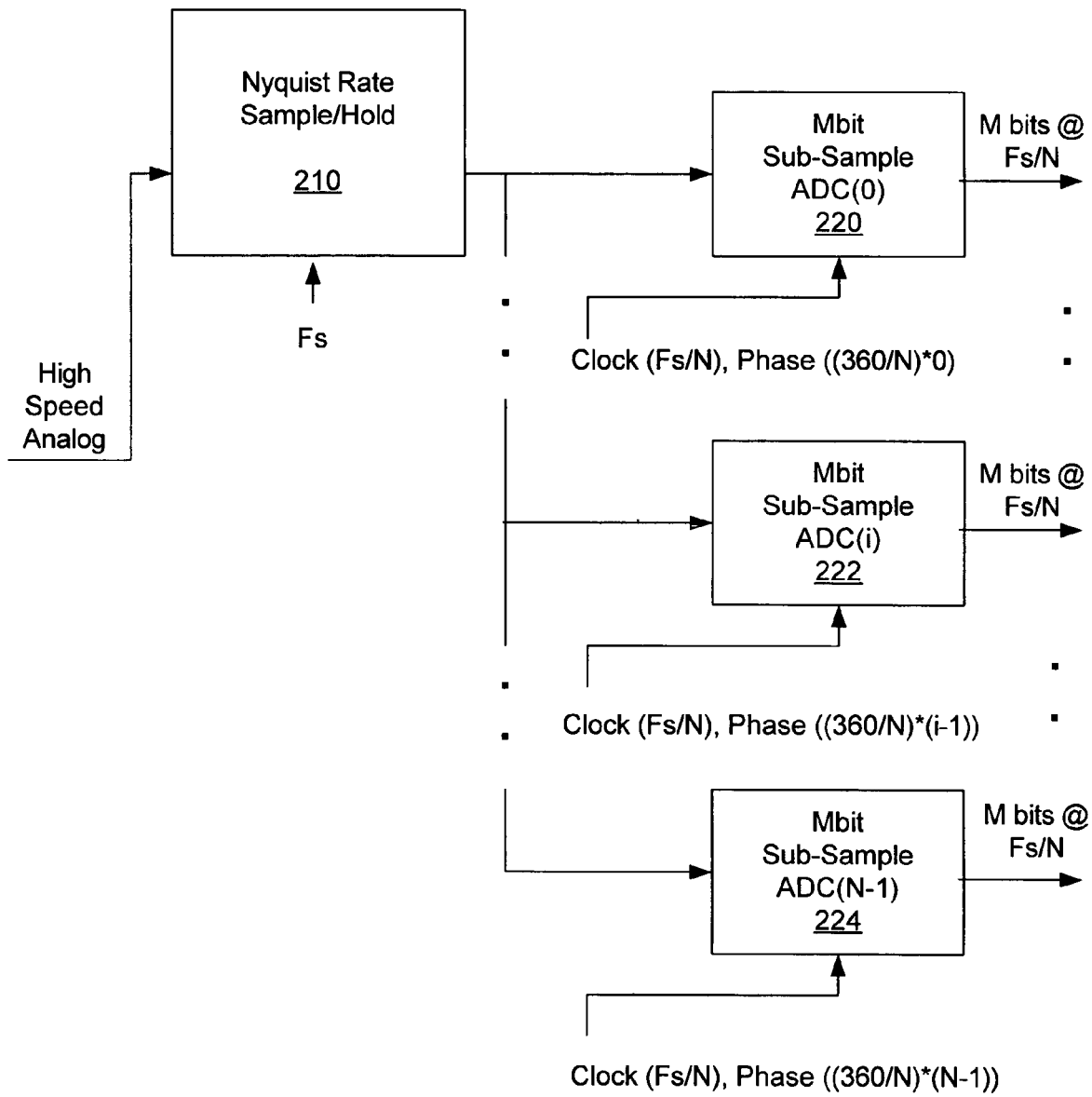
FIG. 2 shows another time interleaved analog to digital converter architecture.

The double sampling of the circuit of FIG. 5 provides twice the conversion rate of the circuit of FIG. 4. That is, twice the number of samples are generated for each clock cycle than for the circuit of FIG. 4. For the block diagram shown in FIG. 2, if the sampling frequency is Fs, then the rate of samples at the output of each of the time interleaved ADCs would be 2*(Fs/N), having M-bits of resolution. Therefore, by using double sampling with time interleaved ADCs, only half the number of ADCs are required.

FIG. 6 shows a time interleaved analog to digital converter that includes double sample, sub-sample ADCs. The phase of the clock (Fs/N) to each of the double sample sub-ADCs is (360/N)*i, where i now varies from 0 to (N/2−1). The clocking of the "pong" phase of the double sampling is approximately 180 degree out of phase with the "ping" phase, and can be generated internally within each ADC. An alternate embodiment includes each of the N/2 sub-ADCs receiving two clocks that have a phase of (360/N)*i, and (360/N)*i+180 (approximately).

By way of example, if N=8, the double sampling embodiment of FIG. 5 only requires 4 double sampled sub-ADCs. The phase of the clock (Fs/8) for the sub-ADC would be 0, 45, 90, 135 degrees respectively. It should be noted that while the number of operational amplifiers is deceased by a factor of two, the number of switches and capacitors of the associated switched capacitor circuits is not decreased by implementing a double sampling configuration.

As described earlier, the common mode voltages in (vcmin, vcmin') can be biased at different voltages. This allows the switched capacitor circuit to provide isolation between two different power supplies. The existence of the two power supplies allows the switches on either side of the charging capacitors Cping, Cpong to be controllable by clocks having different on/off voltage levels. Additionally, the existence of more than one power supply allows the analog signal to be referenced to a different power supply (higher or lower) that the output signal of the sample and hold circuit.

The using the double sampling circuit of FIG. 5 with associated time interleaved ADCs can cause SNR degradation due to gain errors, offset errors and timing errors. However, in time interleaved converters where these errors are already compensated for, the influence of double sampling on SNR degradation can be minimized as long as the signals coming from the double-sampling ADCs are independently processed.

Noticeably, in FIG. 6, the ADCs (now labeled Mbit Double Sample, Sub-sample ADCs) include two outputs, one for each sample.

Before proceeding into the discussion of the sampling circuit in FIGS. 7,8,9,10, a general observation is made on the use of terms "sampler", "tracking", "hold", and "samples" as used in this text. A sampler has at least one clock signal input and at least one analog signal input and output, and can perform the function of following closely ("tracking") the input analog signal to the output during one phase (track phase) of the clock signal and "holding" the output of the sampler substantially constant in the other phase (hold phase) of the clock signal. "Samples" are generated by tracking the input to the output in one phase and holding the last tracked value at the output before the end of the track phase, during the hold phase.

Figure 7A:
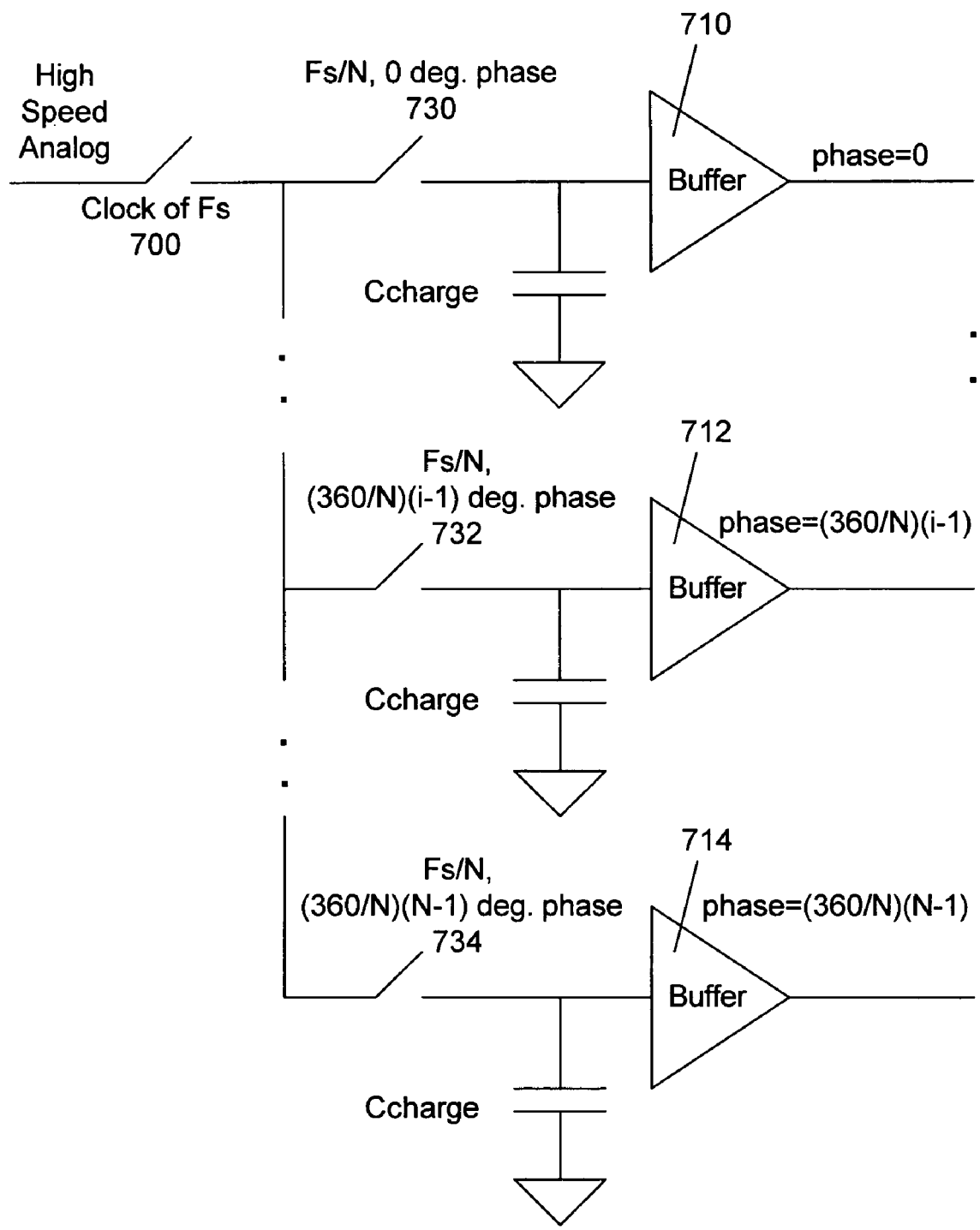
FIG. 7A shows a sampling architecture that can be implemented within a high-speed, time interleaved ADC architecture.

FIG. 7A shows a sampling circuit embodiment that can be implemented within a high-speed, time interleaved ADC architecture. The sampling circuit includes a first sampler (shown as a switch 700) receiving an analog signal and generating first samples at a rate of Fs. A plurality of N second samplers 730, 732, 734, each receive the output of the first sampler, an ith second sampler generating second sub-samples at a rate of Fs/N and having a relative phase of approximately (360/N)*(i−1) degrees, where i varies from 1 to N. The clocks (timing/phase) to the second samplers are controlled so that at most two second samplers are tracking the output of the first sampler at any point of time. Another embodiment includes at most one of the N second samplers tracking the output of the first sampler at any point in time.

An embodiment of the samplers 700, 730, 732, 734 includes switches that are driven by clock signals. Each clock signal can include "on" periods which drive corresponding switches on (closed), and "off" periods that drive corresponding switches off (open). When a switch is on, input signals to the switch are passed to an output of the switch, and when a switch is off, the output of the switch cannot move substantially (corresponding with a "held" state). Switches controlled by clock signals perform a tracking function with the switches are on (closed), and perform a hold function when the switches are off (open). The transition from on to off provides sampling of the input signal to the switch. The sample value is the value of the input signal at the last moment the switch is on.

The sampling embodiment includes sub-sampling. More specifically, the second set of samplers 730, 732, 734, are clocked at a lower frequency (Fs/N) than the first sampler 700. The result is that the duration in time in which the output signal of the sampling circuit is held for the processing of the sub-ADCs is greater.

The transition from "on" to "off" of the second set of samplers 730, 732, 734 occurs during the "off" time of the first sampler (switch) 700. Therefore, this transition from track to hold of the second samplers occurs during the time that the output of the first sampler 700 is held. As long as the sub-sampled sampling of the second samplers 730, 732, 734 occurs after a falling edge of the first sampler clock (Fs), and before the next rising edge of the first sampler clock (Fs), undesirable skew between the sub-sampled clocks (Fs/N) do not contribute to degradation of SNR. The output of the combined first and second samplers is held for a longer time period referenced to the period of the sub-sample clock (Fs/N). That is, the outputs of the second samplers are held during the off period of the Fs/N clock. This is a very desirable feature because the inputs to ADCs connected to outputs of the sample and hold circuits are held stable for a longer duration of time.

It should be noted that the circuit configuration of FIG. 7A is actually a track and hold circuit rather than a sample and hold circuit because the first sampler and the second samplers operate at different frequencies, and therefore, the clock frequencies of the first sampler and the second sampler cannot be opposite in phase.

The second set of samplers 730, 732, 734 track the output of the first sampler 700, approximately one sampler at a time. This provides the advantage of reducing the amount of loading seen by the first sampler. The lack of loading advantage is ensured by making sure the on-periods (tracking period) of the second samplers 730, 732, 734 do not overlap, by controlling the duty cycles of the clock signals controlling the second samplers 730, 732, 734. An embodiment can include some overlap, but the overlap is controlled to ensure that no more than two second samplers are ever tracking at the same time. Again, limiting the number of second samplers 730, 732, 734 that are turned on or tracking the output of the first sampler 700 at any point of time, limits the loading of the first sampler 700.

Figure 7B:
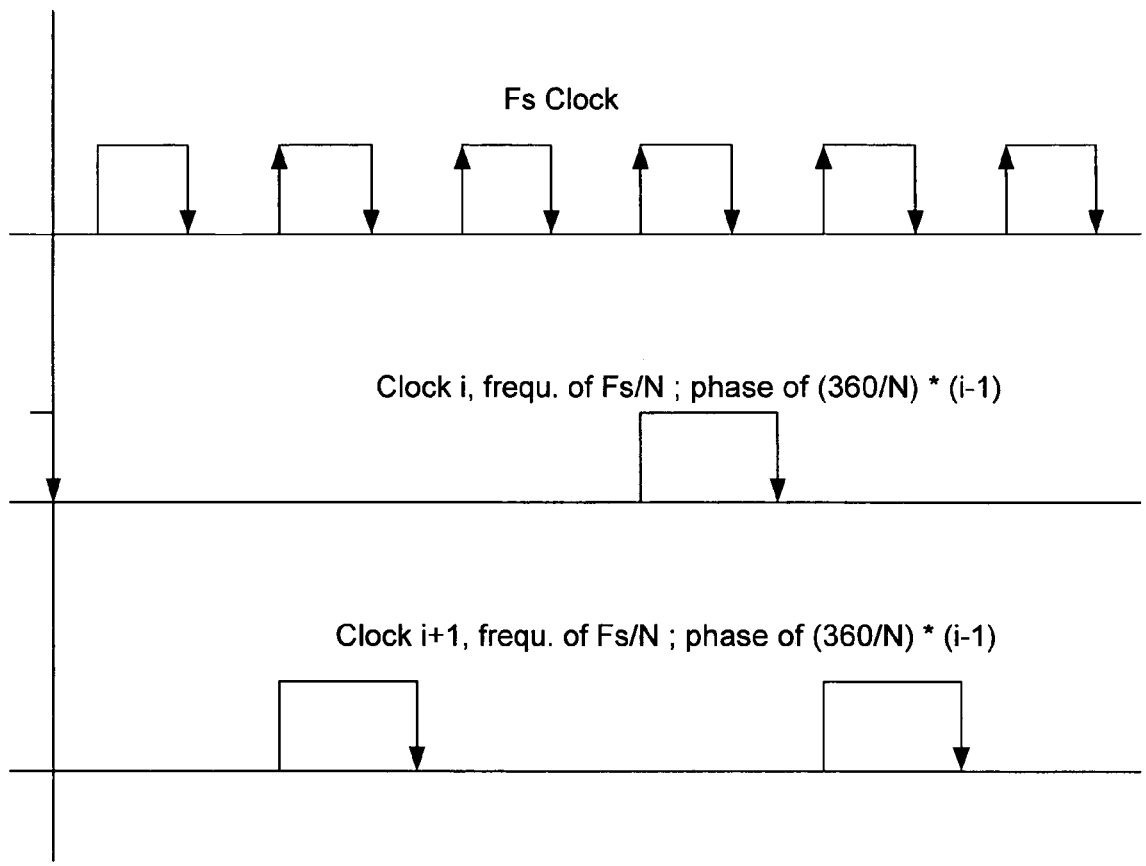
FIG. 7B shows clock signals used to control the sub-sampling sample and hold architecture of FIG. 7A.

FIG. 7B shows exemplary clocking signals for controlling the sampling circuit of FIG. 7. The clocking signals include the Fs clock, and two concurrent second sampler clocks having a frequency of Fs/N, and a phases of approximately (360/N)*(i−1), and (360/N)*(i). The clock waveforms show the second samplers being turned on at different time intervals. More specifically, in this FIG. 7B, the second samplers are controlled so that at most one of the second samplers are turned on or tracking at a time. Each of the second samplers track the output of the first sampler at some point in time.

Buffers 710, 712, 714 are included at outputs of charging capacitors (Ccharge). The buffers 710, 712, 714 provide signal drive for driving ADCs that may be connected to outputs of the sampling circuit.

The sampling circuit of FIG. 7A includes a single ended implemetation. However, differential implementation can just an easily be implemented.

The First Sampler

Figure 7C:
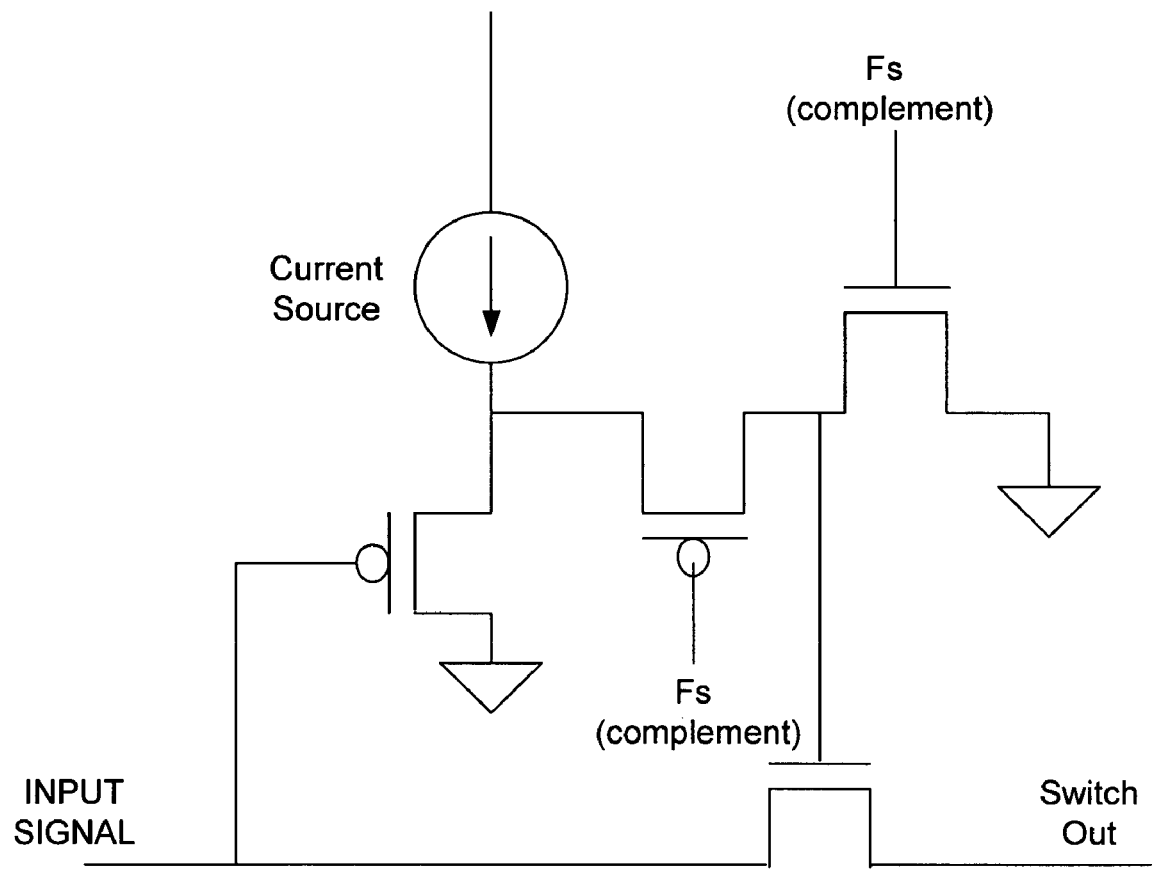
FIG. 7C shows a switch control circuit.

Several circuit embodiments can be used to implement the first sampler 700. For example, the first samples can be generated by tracking the analog signal during one phase of an Fs clock signal, and holding the output of the first sampler during another phase of the Fs clock signal. An embodiment includes the Fs clock signal driving a track/hold switch to be closed during tracking, and the Fs clock signal driving the track/hold switch to be open during holding. Another embodiment of the first sampler is a switch, the resistance of the switch being maintained as substantially constant when the switch is closed, and the switch receiving a full signal swing of the analog signal. An embodiment includes the resistance of the switch being maintained substantially constant by a circuit that modulates the clock signal driving the switch, thereby maintaining a substantially constant gate to source voltage of a transistor within the switch. A circuit that can accomplish this is shown in FIG. 7C.

Other embodiments are possible which maintain the resistance of the switch substantially constant by a circuit that modulates the clock signal drving the switch, without maintaining the constant gate to source voltage of the transistor within the switch. In such embodiments, the threshold voltage variation of the switch with the swing of the signal is also taken into account.

The Second Samplers

The second samplers can also be implemented with switches. The second samplers can additionally include switch capacitor circuits. An embodiment includes the second sub-samples being generated by tracking an output signal of the first sampler during one phase of an Fs/N clock signal, and holding output signals of the second samplers during another phase of the Fs/N clock signal. An embodiment includes a transition from the tracking to the holding of the second samplers occurring during the holding phase of the first sampler output.

Figure 8:
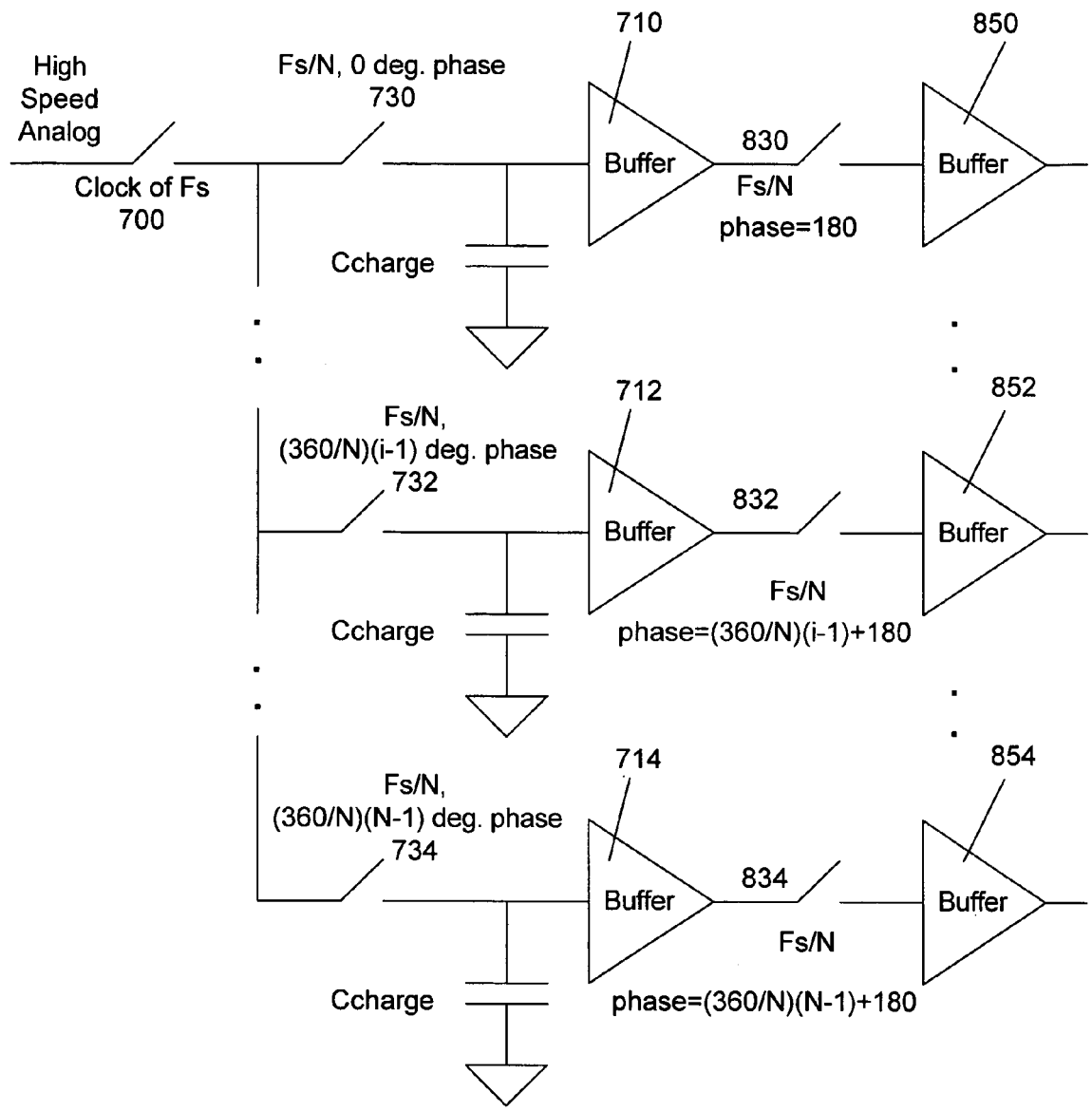
FIG. 8 shows a sub-sampling sample and hold architecture that includes sampling at complimentary phases.

FIG. 8 shows a sub-sampling sample and hold architecture that includes sampling at opposite phases. This embodiment is an evolution of the embodiment shown in FIG. 7. Generally, this embodiment includes a first sampler 700 receiving an analog signal and generating first samples at a rate of Fs. A plurality of N second samplers 730, 732, 734, each receives the output of the first sampler, and an ith second sampler generates second sub-samples at a rate of Fs/N and having a relative phase of approximately (360/N)*(i−1) degrees, where i varies from 1 to N. A plurality of N third samplers 830, 832, 834 receive the output of the second samplers, an ith third sampler generating third sub-samples at a rate of Fs/N and having a relative phase of approximately ((360/N)*(i−1)+180) degrees.

FIG. 8 shows a single ended implementation. However, this embodiment can easily be modified to include differential implementations.

As shown in FIG. 8, buffers 840, 842, 844 are located between the second samplers 820, 822, 824 and the third samplers 830, 832, 834, and buffers 850, 852, 854 are located at outputs of the second samplers 830, 832, 834. The second sampler/third sampler embodiments of FIG. 8, convert the track and hold circuit of FIG. 7 into a sample and hold circuit. The third sampling of the third samplers 830, 832, 834 is complementary (180 out of phase) from the second sampling of the second sampler 820, 822, 824. The embodiment, however, includes buffers that face a full signal swing, and does not include double-sampling.

Figure 9:
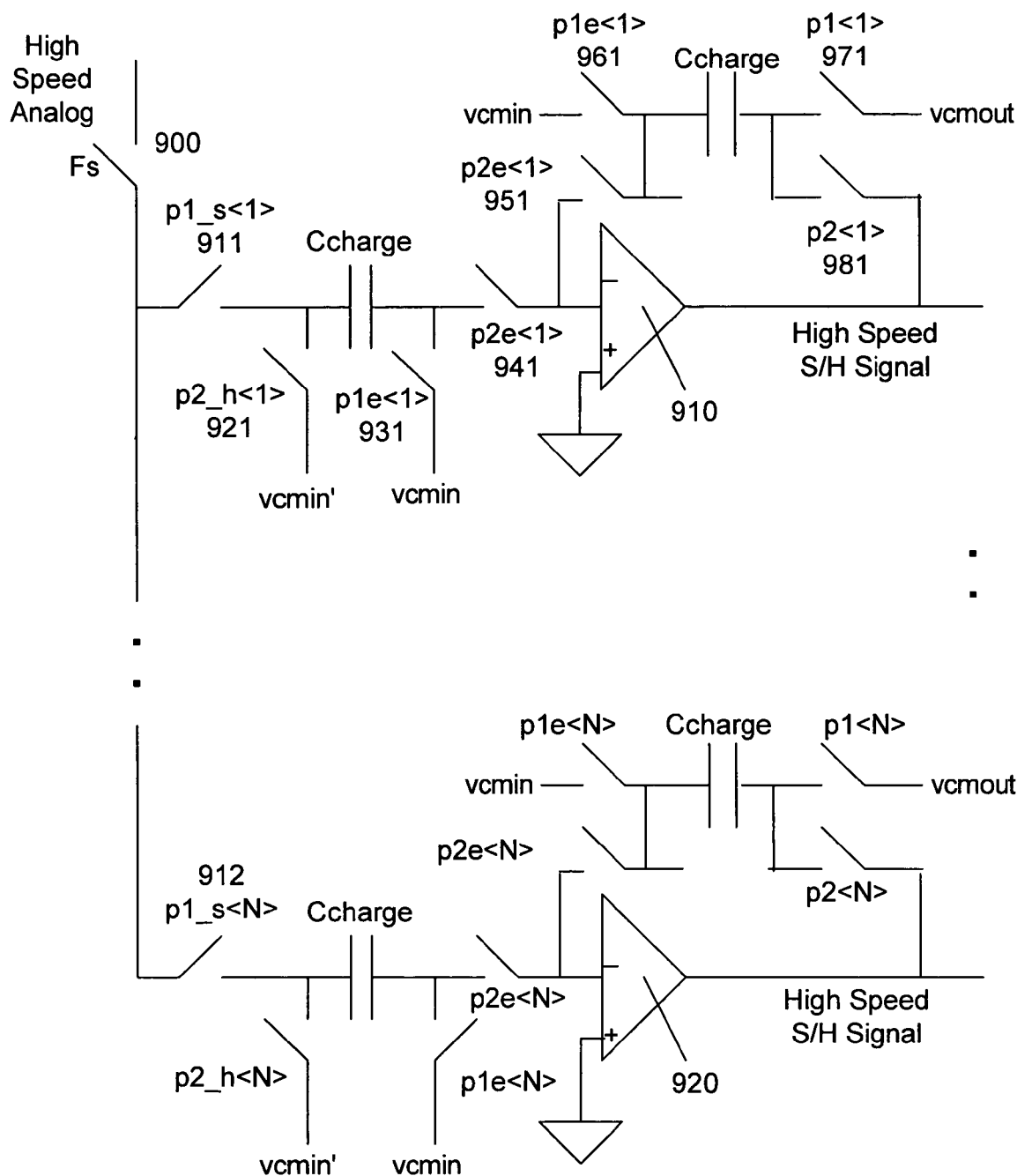
FIG. 9 shows a sub-sampling sample and hold architecture that provides a virtual ground of an operational amplifier within the sample and hold.

FIG. 9 shows another sampling circuit, that is configured as a sample and hold circuit. The sample and hold circuit provides a virtual ground of an operational amplifier within the sample and hold circuit. Here, the second samplers and the third samplers are implemented with switched capacitor circuits.

The N sub-sampling circuits of FIG. 9, essentially convert the track and hold circuit of FIG. 7, into a sample and hold circuit. The result is an operational amplifier design that includes a low input signal voltage swing compared to the high voltage swings possible in the embodiment of FIG. 7. This can advantageously provide improvements in accuracy and linearity of the sampling circuit.

The first samples are obtained by clocking (opening and closing) a first sampler 900 (switch) at a clock frequency of Fs. Each of the N second samplers receive the output of the first sampler 900. The second samples are generated by second samplers that include switches 911 and 931 and capacitor Ccharge. The switches 911, 931 are closed while switches 921, 941 are open, charging the associated charging capacitor Ccharge. During second sampling of the first second sampling chain (of the N chains), the clock signals p1e<1> and p1_s<1> are asserted, turning on switches 931, 911. Sampling is achieved by de-asserting the clock signal p1e<1>. The third sampler comprises the switches 921 and 941 with the capacitor Ccharge. The charge of the charging capacitor Ccharge is sampled in the opposite phase by the clock signal p2e<1> and p2_h<1>, turning on switches 941 and 921, and transferred to the processing circuit of the feedback of the operational amplifier. The clock signals are analyzed in greater detail in FIGS. 10B and 10C.

Generally, for an ith second sampler and ith third sampler, p1e<i> has a frequency of Fs/N, a phase of (360/N)*(i−1), and turns off earlier than p1_s<i>, p1_s<i> has a frequency of Fs/N, a phase of (360/N)*(i−1), but delayed with respect to p1e<i>, and has approximately 1/N duty cycle, p2e<i> has a frequency of Fs/N, a phase of (360/N)*(i−1)+180 and turns off earlier than p2_s<i>, and p2_s<i> has a frequency of Fs/N, a phase of (360/N)*(i−1)+180, but delayed with respect to p2e<i>, with an approximate duty cycle of 1/N.

The second samplers 911, 912 of FIG. 9 sample output of the first sampler 900, and are controlled by Fs/N clock signal having 1/N duty cycles so that no two second samplers are tracking the output of the first sampler 900 at the same time. The first sampler 900, is therefore, lightly loaded providing greater bandwidth for lesser power.

Figure 10A:
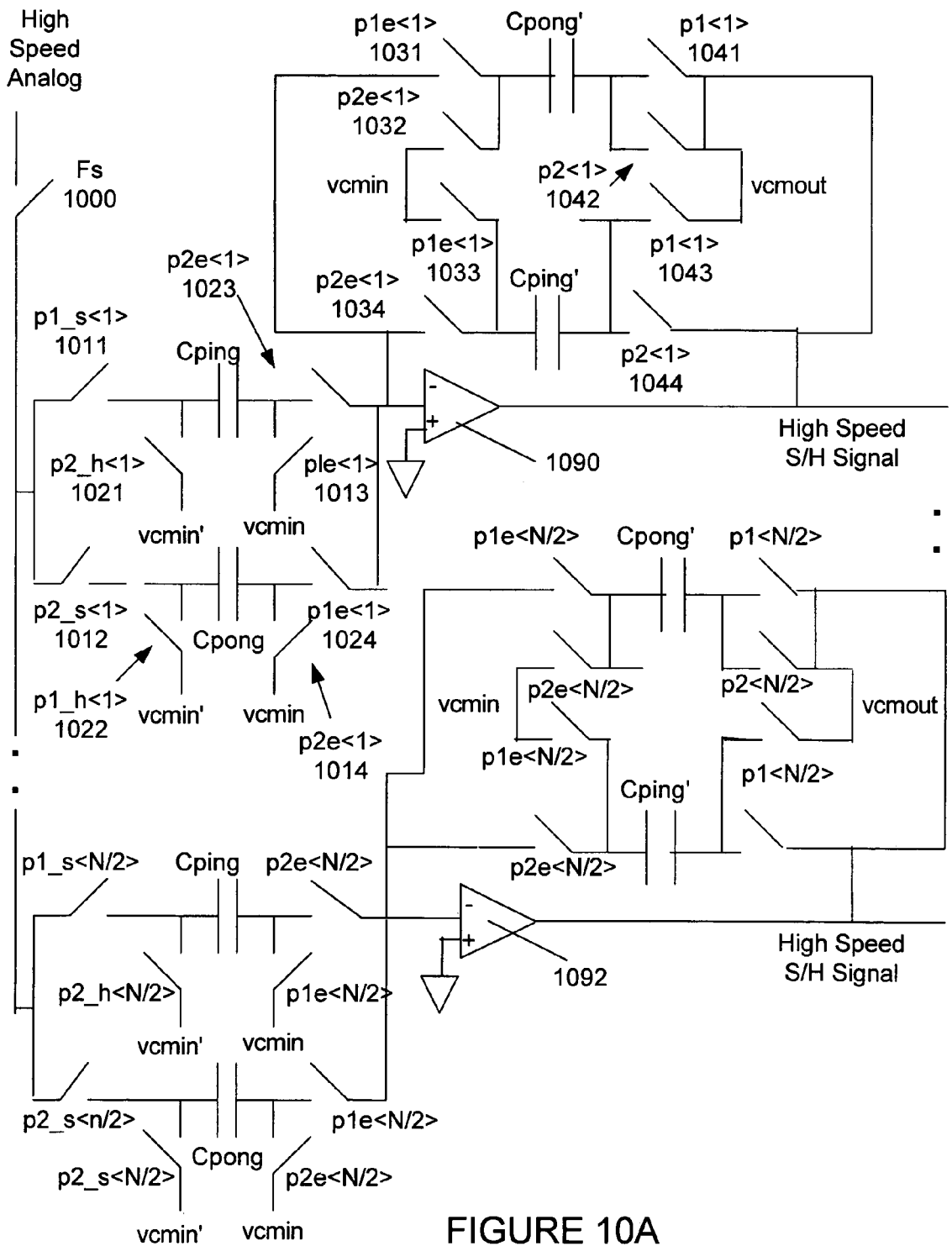
FIG. 10A shows double sampling, sub-sampling, sample and hold circuit architecture in series with a high-speed switch.

FIG. 10A shows double sampling, sub-sampling, sample and hold circuit architecture in series with a high-speed switch 1000. This embodiment provides the combined advantages of the embodiments of FIGS. 7, 8 and 9, and additionally, provides double sampling.

As shown, FIG. 10A shows N/2 sample and hold circuits that generate N sample and hold outputs. A single one of the N/2 chain will be described. It is to be understood that the other N/2−1 chains operate similarly.

A first chain includes the operational amplifier 1090. An N/2 chain includes the operational amplifier 1092. A switched capacitor circuit including the second sampler and the third sampler is configured in a double sampling mode through the use of "ping" and "pong" switched capacitor circuits. The two charging capacitors Cping and Cpong correspond to the previously described ping and pong switched capacitor circuits. The ping and pong charging capacitors Cping, Cpong are connected together at an input node of the operational amplifier 1090 through switches 1023 and 1024, which acts as a virtual ground. As previously described in the FIG. 5 double sampling description, one of the two charging capacitors Cping or Cpong is charging (sampling) while the other is discharging (evaluating). Therefore, the operational amplifier 1090 is used efficiently in both the ping and pong charging phases. The charging (sampling) and discharging (evaluation) phases of the switched capacitor circuits are controlled by clock signals p1_s<i>, p1e<i>, p1_h<i>, p1<1>, p2_s<i>, p2e<i>, p2_h<i>, p2<i>. For i=1, the control clock signal p1_s<1> drives switch 1011, p1e<1> drives switches 1013, 1024, 1031, 1033, p1_h<1> drives switch 1022, p1<1> drives switches 1041, 1043, p2_s<1> drives switch 1012, p2e<1> drives switch 1023,1014,1032,1034, p2_h<1> drives switch 1021, and p2<1> drives switches 1042 and 1044.

A feedback circuit is also included within the sample and hold circuit of FIG. 10A. The feedback of the operational amplifier 1090 includes switched capacitor circuits that include similar charging capacitors Cping' and Cpong'. The charging capacitors Cping' and Cpong' can be different than the previously described charging capacitors Cping and Cpong. The nodes ncmin, vcmin' and vcmout can be used with similar significance as described earlier.

By way of example, operation of a double sampling, sub-sampling, sample and hold circuit of FIG. 10A in which N=8, can be as follows. First samples are generated at a rate of Fs, by the first sampler as controlled by clock signal Fs. The samples are generated every 1/Fs. Second samples are generated by the second samplers at a rate of Fs/N. With N=8, 4 operational amplifiers are required, and an associated set of time interleaved ADCs only requires 4 ADCs.

Of the N=8 samples generated, a first chain (corresponding to first ADC) of the double sampled, sub-sampled Sample and Hold processes samples 1 and 5 from the first sampler. A second chain (corresponding to second ADC) of the double sampled, sub-sampled Sample and Hold processes samples 2 and 6 from the first sampler. A third chain (corresponding to third ADC) of the double sampled, sub-sampled Sample and Hold processes samples 3 and 7 from the first sampler. A fourth chain (corresponding to fourth ADC) of the double sampled, sub-sampled Sample and Hold processes samples 4 and 8 from the first sampler.

The switched capacitor and clocking scheme of the embodiment of FIG. 10A includes double sampling, and provides the several performance enhancements as compared to the embodiment of FIG. 7. The embodiment of FIG. 10A provides reduced common mode signal transfer from the input to the output. The input can be referenced to a different power supply than the output. This embodiment is less sensitive to the parasitic capacitances of the charging capacitors. The output of the sample and hold circuit includes only sub-sampled signals, thereby reducing non-linearities associated with high speed track signals. The operational amplifier 1090 of FIG. 10A is subject to much lower input signal swings than the buffers of other embodiments, thereby easing design requirements for accuracy and linearity. Additionally, the embodiment of FIG. 10A includes double sampling, and therefore, benefits from the improved power consumption.

Figure 10B:
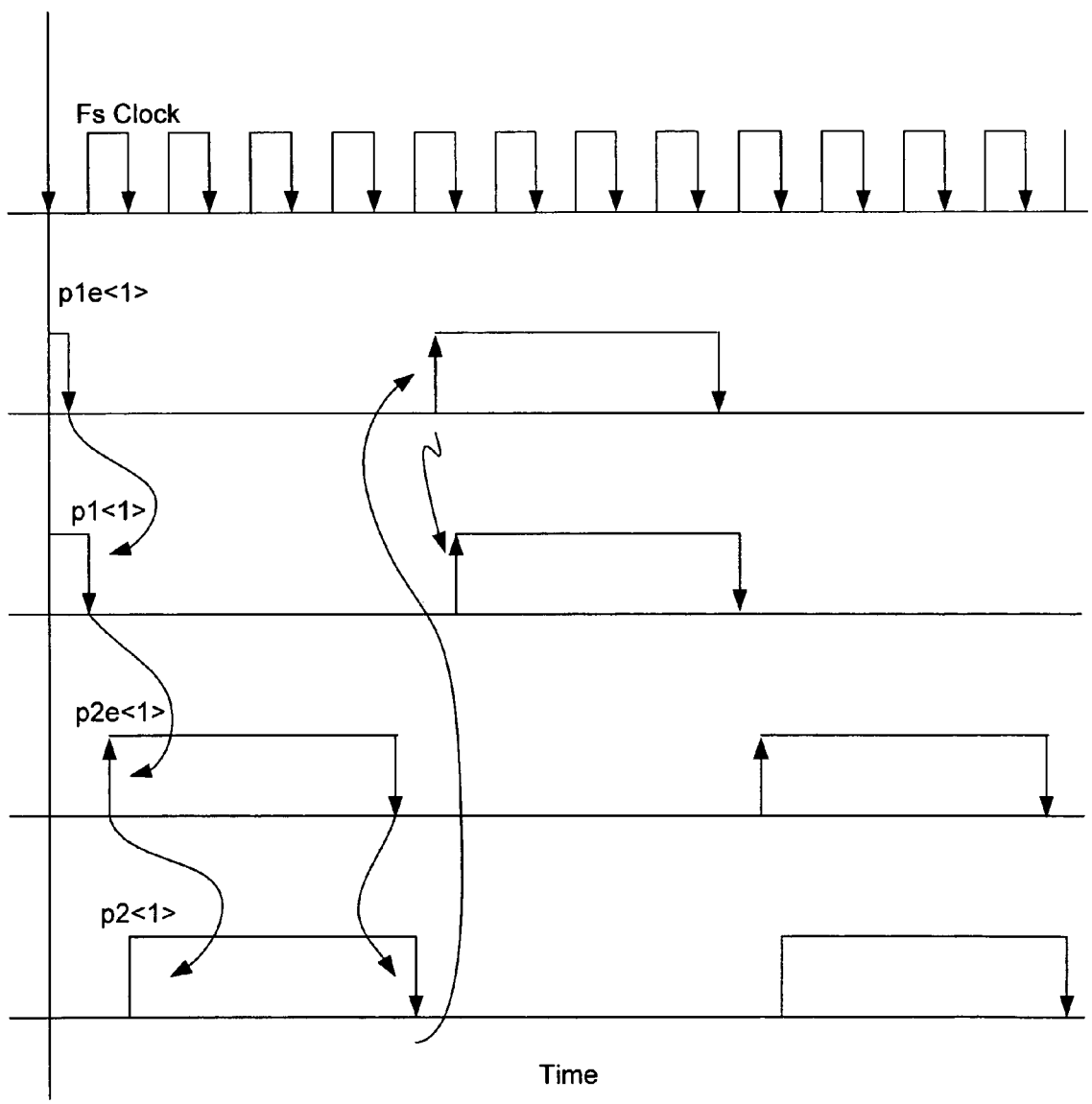
FIGS. 10B and 10C shows clock signals used to control the double sampling, sub-sampling, sample and hold circuit architecture of FIG. 10A.
Figure 10C:
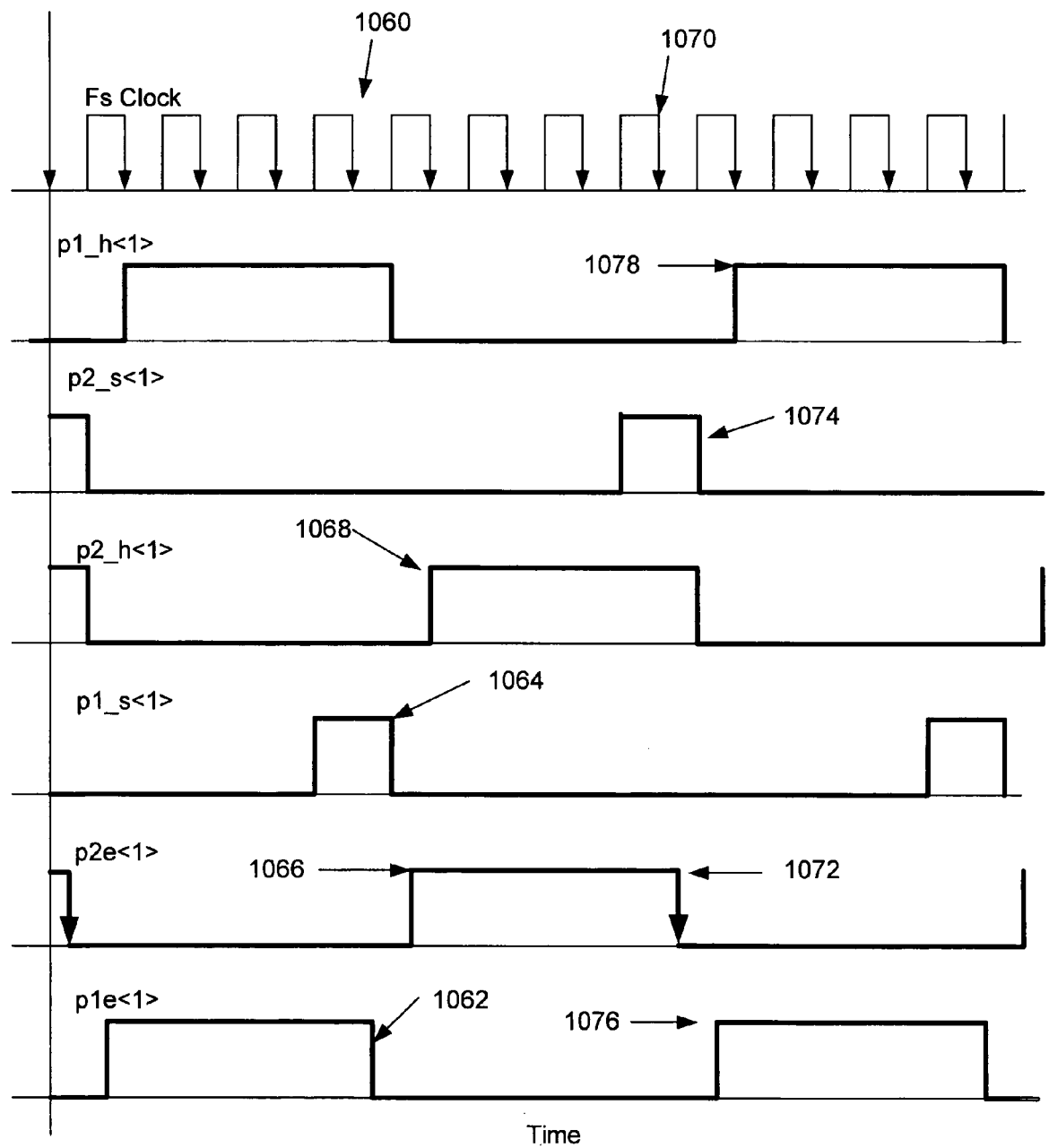

FIGS. 10B and 10C showing timing diagrams of exemplary clock signals of the circuit of FIG. 10A.

As shown in FIG. 10C, after a falling edge 1060 of the clock Fs (chosen arbitrarily at time t), a falling edge 1062 of the sub-sampled clock p1e<1> occurs. The clock p1e<1> has approximately 50% duty cycle, and is connected to (drives) the switch 1013, as well as other switches as shown in FIG. 10A. Another clock p1_s<1> (FIG. 10C) is generated such that this clock has a low duty cycle approximately equal to 1/N. This duty cycle is selected so that no two capacitors (or at least never more than two capacitors) in second sub-sampling samplers load the first sampler 1000 at the same time. The switch 1011 driven by p1_s<1> is connected in series with the first sampler switch 1000 which is controlled by the clock signal Fs. The falling edge 1064 of p1_s<1> is forced to occur after falling edge 1062 of p1e<1> in the clock generator circuit. Therefore it does not contribute to signal dependent charge injection, as the switch 1013 sampled with p1e<1> does not have signal dependent charge, and its turn-off cannot contribute to signal dependent charge injection.

The first sample is taken with respect to a falling edge 1060 of the high speed clock Fs of the first sampler 1000. The first sample (of the eight) is sampled by the "ping" portion of the second sub-sampled sampler, at the falling edge 1062 of clock p1e<1>. The corresponding clock p1_s<1> has a 1/N duty cycle, ensuring that when sampling is being performed by the ping portion of the sub-sampled second sampler, no other sampler in the set of sub-sampled second samplers loads the first sampler 1000. The evaluation phase is controlled by the clock signals p2e<1> and p2_h<1>, which are complementary to p1e<1>, p1_h<1>. The evaluation is performed by the third sampler. During the evaluation phase, the first sample is transferred to the output of the sample and hold circuit of FIG. 10A. This is achieved by turning on switch 1023 with clock signal p2e<1> and then turning on switch 1021 with clock signal p2_h<1>. These two operations are achieved by the rising edge 1066 of p2e<1> and rising edge 1068 of p2_h<1>.

The fifth sample is taken with respect to a falling edge 1070 of the high speed clock Fs of the first sampler 1000. The fifth sample (of eight) is sampled by the "pong" portion of a second sub-sampled sampler, at the falling edge 1072 of clock p2e<1>. The corresponding clock p2_s<1> has a 1/N duty cycle, ensuring that when sampling is being performed by the pong portion of the sub-sampled second sampler, no other sampler in the set of sub-sampled second samplers loads the first sampler 1000. The switch 1012 driven by p2_s<1> is connected in series with the first sampler switch 1000 which is controlled by the clock signal Fs. The falling edge 1074 of p2_s<1> is forced to occur after falling edge 1072 of p2e<1> in the clock generator circuit. The evaluation phase is controlled by the clock signals p1e<1> and p1_h<1>, which are complementary to p2e<1>, p2_h<1>. The evaluation is performed again by the third sampler. During the evaluation phase, the fifth sample is transferred to the output of the sample and hold circuit of FIG. 10A. This is achieved by turning on switch 1024 with clock signal p1e<1> and then turning on switch 1022 with clock signal p1_h<1>. These two operations are achieved by the rising edge 1076 of p1e<1> and rising edge 1078 of p1_h<1>.

Paralleling the description of the N=1 sample and hold circuit, the N=2, 3, 4 sample and hold circuits perform similar sampling and holding to generate the (2, 6), (3,7), (4,8) samples. That is, the N=2 sample and hold circuit generates the 2 and 6 samples of the eight, the N=3 sample and hold circuit generates the 3 and 7 samples of the eight, and the N=4 sample and hold circuit generates the 4 and 8 samples of the eight.

The clock circuits must be designed that generate the clock signals p1e<1:4>, p2e<1:4>, p1_h<1:4>, p2_h<1:4>, p1_s<1:4>, p2_s<1:4>, p1<1:4>, p2<1:4> shown in FIGS. 10B and 10c.

FIG. 10B shows the clock signals p1<1> and p2<1> in addition to FIG. 10C.>. It is to be understood that these clock signals are exemplary. These clock signals p1<1> and p2<1> are used to drive the switches for one embodiment of the feedback circuit of the operational amplifier 1090 as shown in FIG. 10A. As shown in FIG. 10B, the clock signals p1e<1> and p2e<1> are non-overlapping and clock signals p1<1> and p2<1> are non-overlapping. The clock signals p1<1> is delayed by a small amount with respect to p1e<1>. The clock signal p2<1> is delayed by a small amount with respect to p2e<1>.

Figure 11:
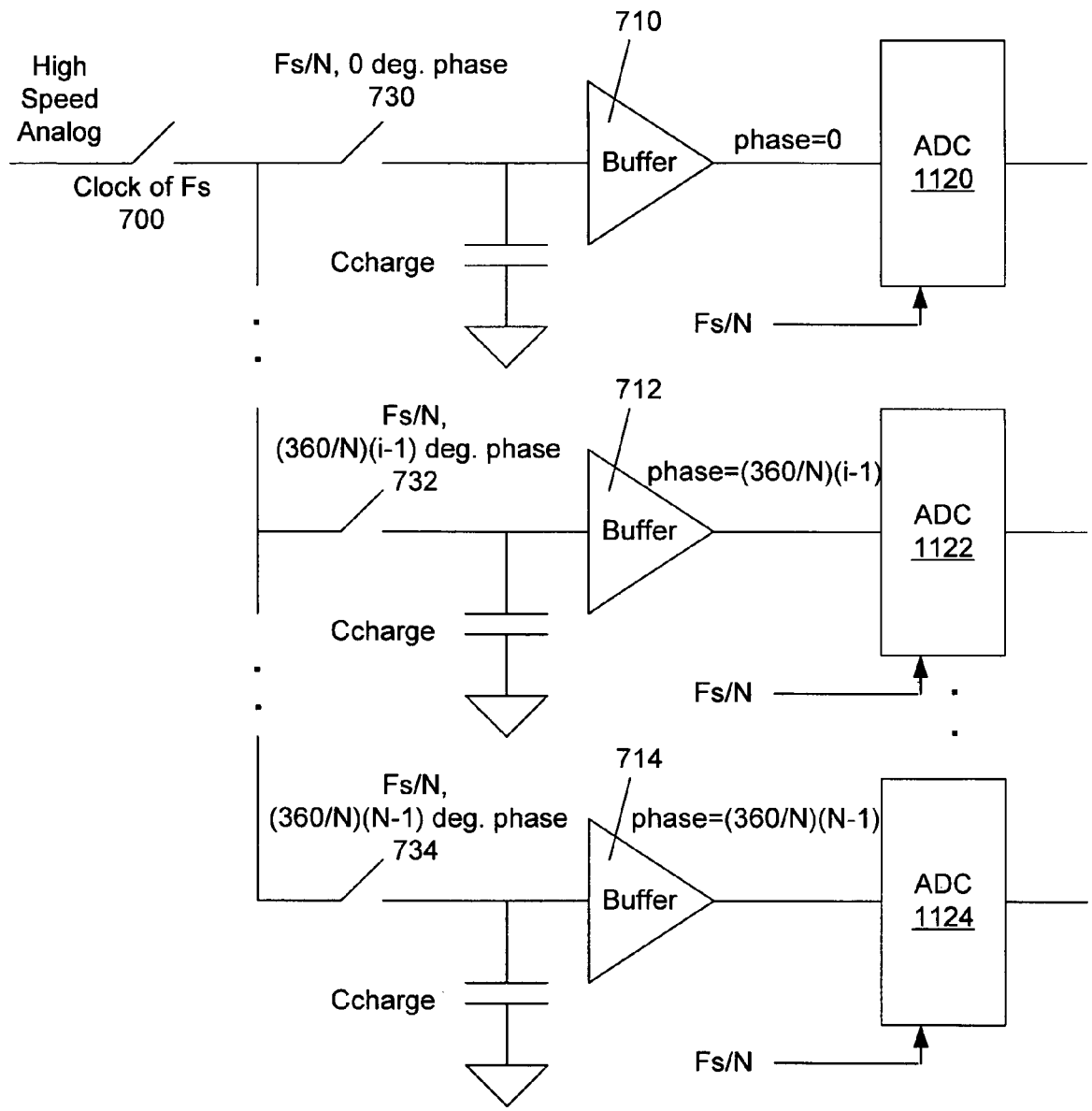
FIG. 11 shows the sampling architecture of FIG. 7, connected to interleaved ADCs.

FIG. 11 shows the sampling architecture of FIG. 7, connected to interleaved ADCs. This embodiment includes N ADCs corresponding to N operational amplifiers of the sampling circuit.

Figure 12:
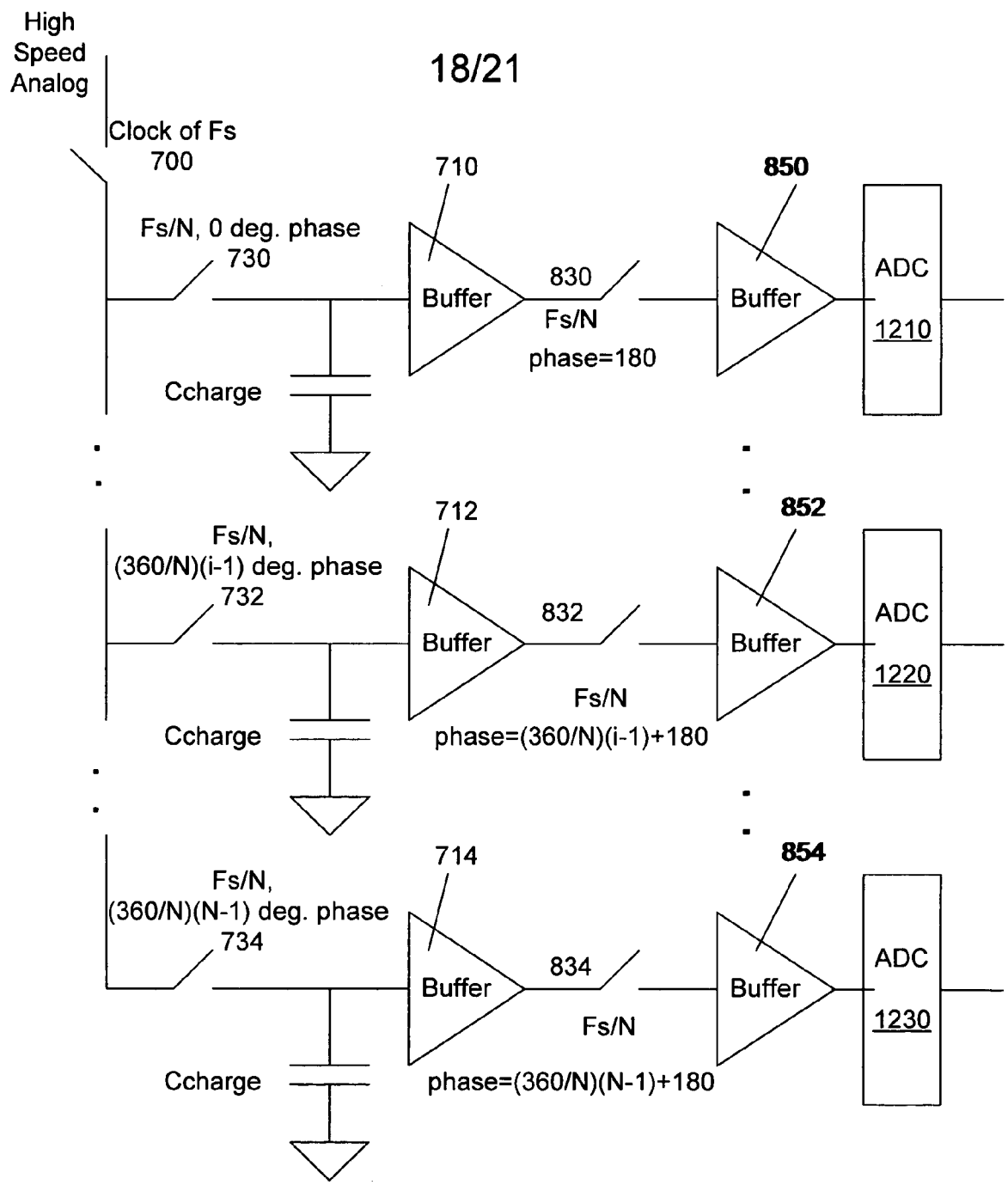
FIG. 12 shows the sub-sampling sample and hold architecture that includes sampling at opposite phases of FIG. 8, connected to interleaved ADCs.

FIG. 12 shows the sub-sampling sample and hold architecture that includes sampling at opposite phases of FIG. 8, connected to interleaved ADCs.

Figure 13:
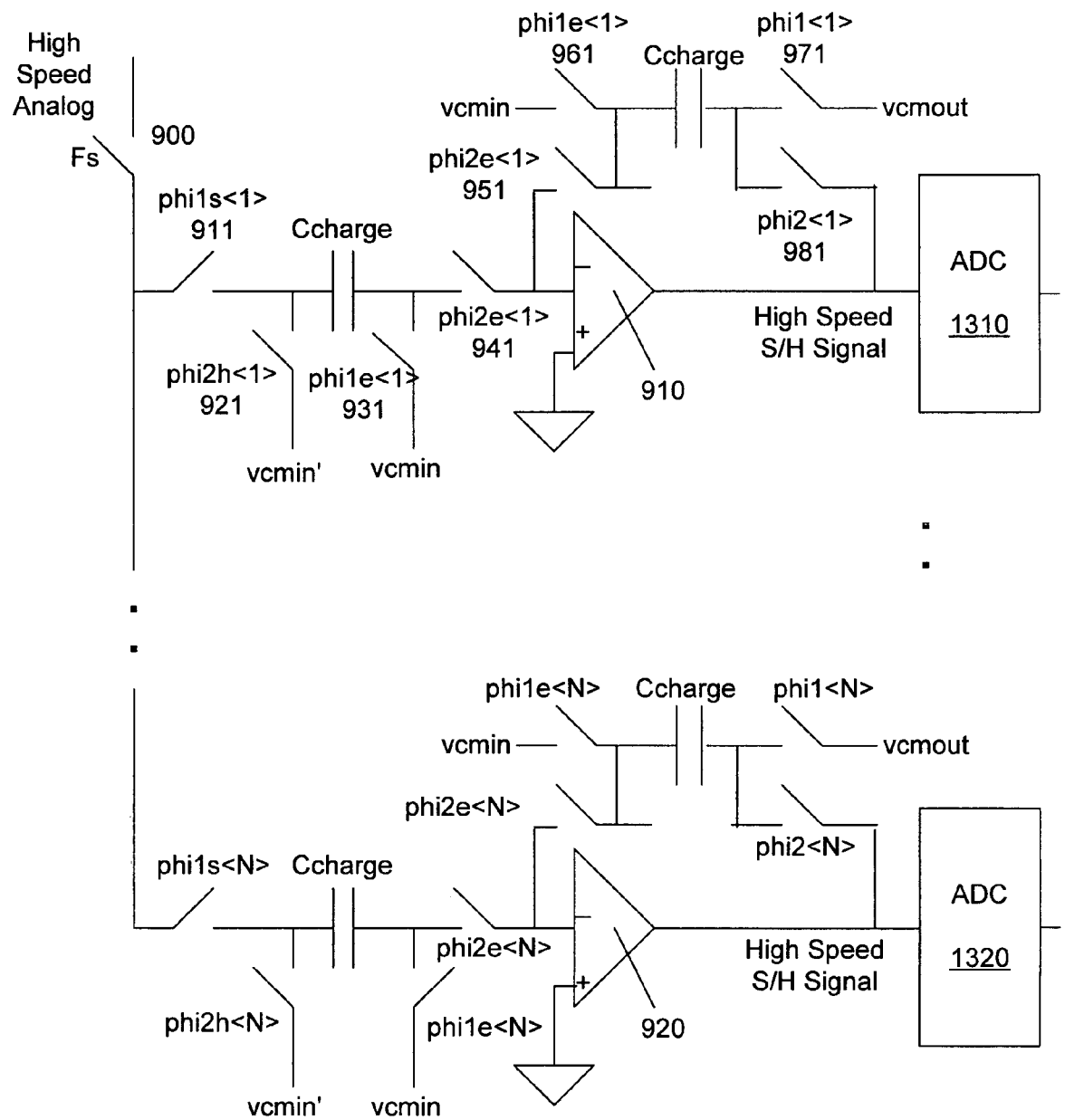
FIG. 13 shows a sub-sampling sample and hold architecture that provides a virtual ground of an operational amplifier within the sample and hold architecture of FIG. 9, connected to interleaved ADCs.

FIG. 13 shows a sub-sampling sample and hold architecture that provides a virtual ground of an operational amplifier within the sample and hold architecture of FIG. 9, connected to interleaved ADCs.

Figure 14:
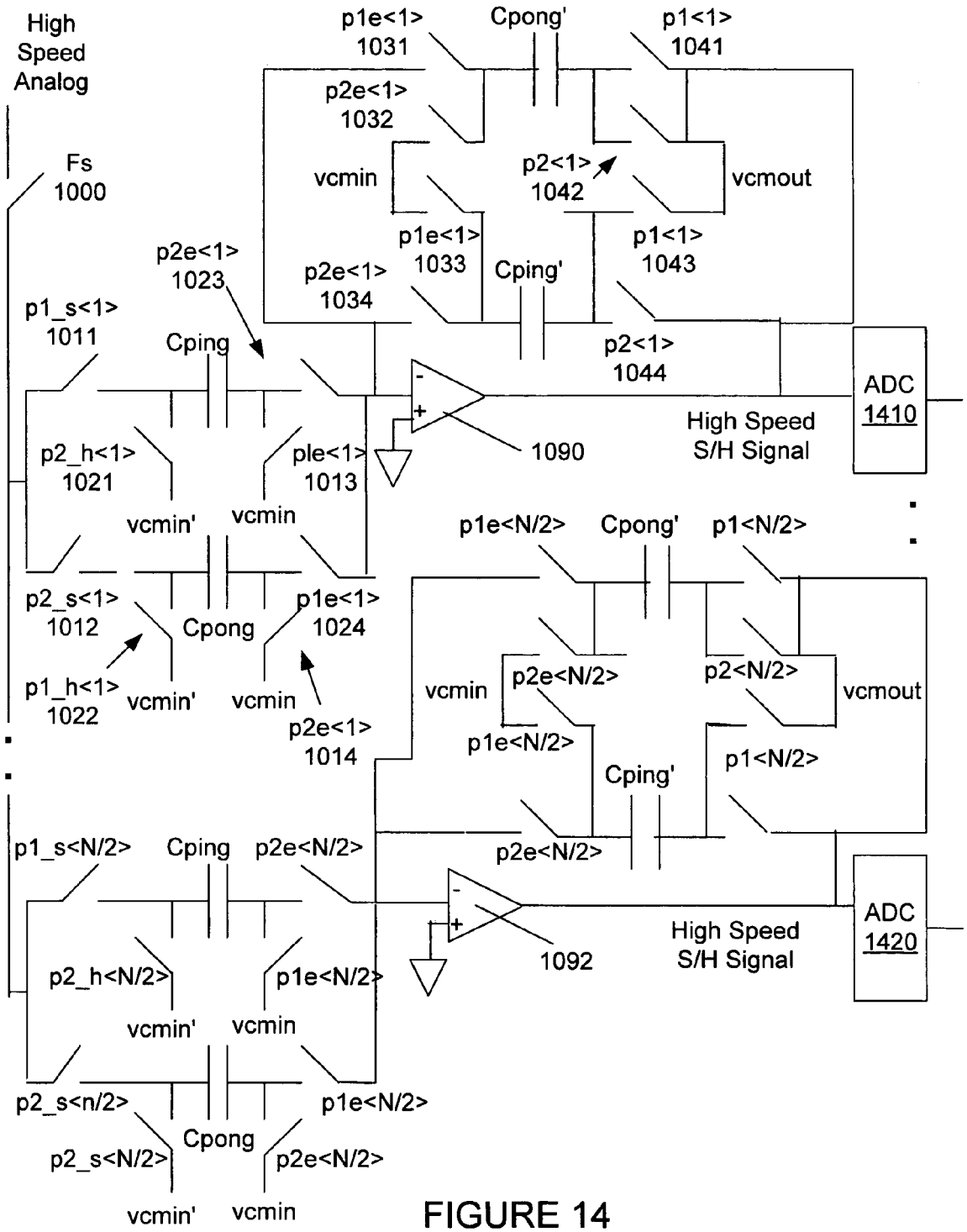
FIG. 14 shows the double sampling, sub-sampling, sample and hold circuit architecture in series with a high-speed switch of FIG. 9, connected to interleaved double sampling ADCs.
Figure 15:
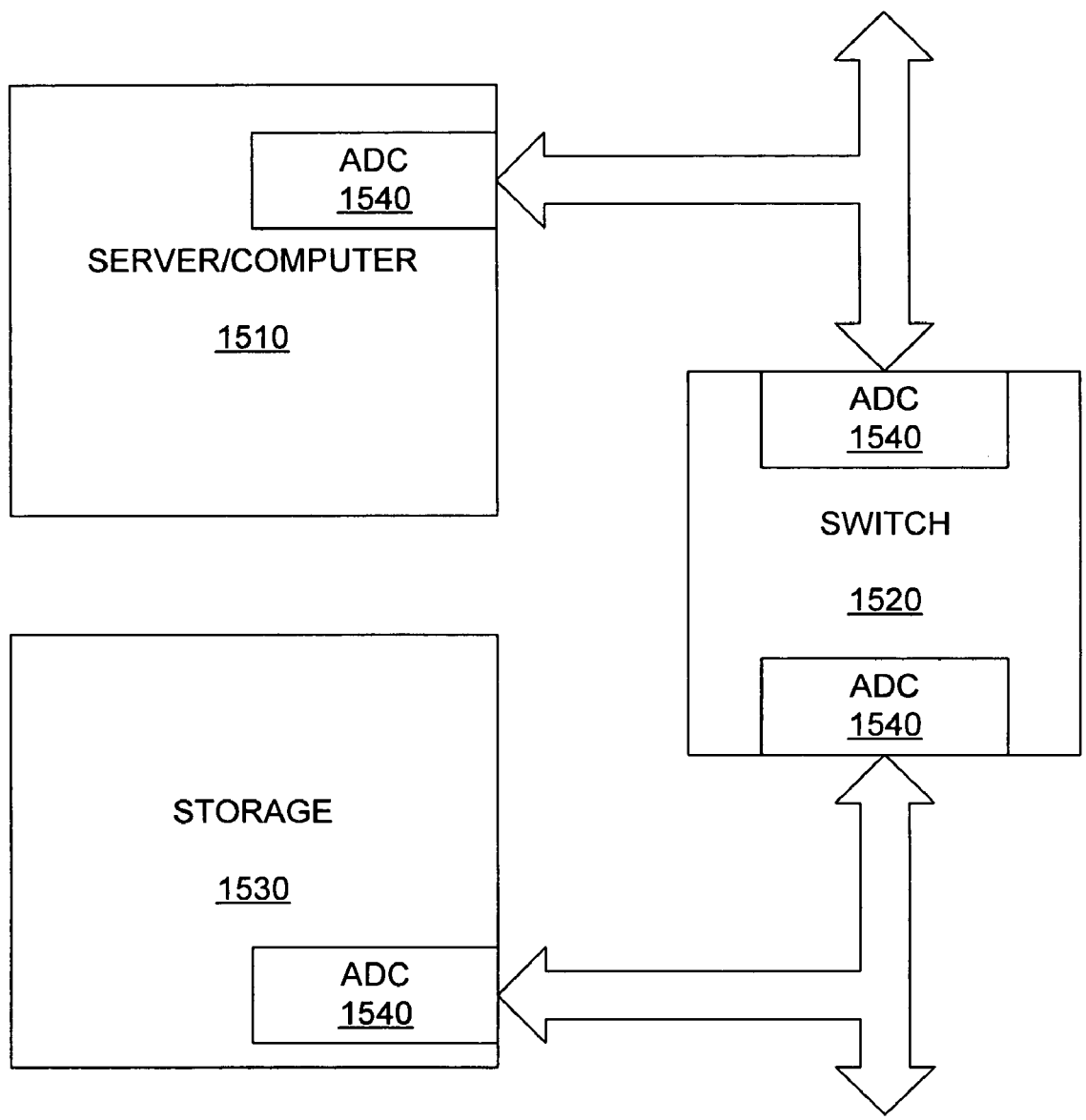
FIG. 15 shows devices connected to an Ethernet network that can include embodiments of the sampling and holding, and analog to digital converting.

FIG. 14 shows the double sampling, sub-sampling, sample and hold circuit architecture in series with a high-speed switch of FIG. 9, connected to interleaved double sampling ADCs.

FIG. 15 shows devices connected to an Ethernet network that can include embodiments of the sampling and holding, and analog to digital converting. Ethernet transceivers can utilize the high-speed interleaved ADCs 1540 as described for reception of analog signals, and conversely, as DACs generating analog signals. The Ethernet transceivers can be included within a server 1510, a switch 1520 or a storage device 1530. Clearly, other types of devices could use the Ethernet transceivers as well.

Although specific embodiments of the invention have been described and illustrated, the invention is not to be limited to the specific forms or arrangements of parts so described and illustrated. The invention is limited only by the appended claims.

What is claimed:

1. A sampling circuit comprising:
   a first sampler receiving an analog signal and generating first samples at a rate of Fs;
   a plurality of N second samplers, an ith second sampler generating second sub-samples from the first samples at a rate of Fs/N and having a phase of approximately (360/N)*(i−1) degrees, where i varies from 1 to N;
   a plurality of N third samplers, an ith third sampler generating third sub-samples from the second sub-samples at a rate of Fs/N and having a phase of approximately ((360/N)*(i−1)+180) degrees.

2. The sampling circuit of claim 1, wherein at most one of the N second samplers are tracking an output of the first sampler at any point in time, and each one of the N second samplers track the output of the first sampler at some point in time.

3. The sampling circuit of claim 1, wherein at most two of the N second samplers are tracking an output of the first sampler at any point in time, and each one of the N second samplers track the output of the first sampler at some point in time.

4. The sampling circuit of claim 1, further comprising a transition from tracking to holding of the second samplers which occurs during the holding of an output of the first sampler.

5. The sampling circuit of claim 1, wherein the second sub-samples and the third sub-samples are time interleaved.

6. The sampling circuit of claim 1, further comprising the first samples being generated by tracking the analog signal during one phase of an Fs clock signal, and holding an output of the first sampler during another phase of the Fs clock signal.

7. The sampling circuit of claim 6, further comprising the second sub-samples being generated by tracking an output signal of the first sampler during one phase of an Fs/N clock signal, and holding output signals of the second samplers during another phase of the Fs/N clock signal.

8. The sampling circuit of claim 6, wherein the Fs clock signal drives a track/hold switch to be closed during tracking, and the Fs clock signal drives the track/hold switch to be open during holding.

9. The sampling circuit of claim 1, wherein the first sampler comprises a switch, a resistance of the switch being maintained as substantially constant when the switch is closed, and the switch receives a full signal swing of the analog signal.

10. The sampling circuit of claim 9, wherein the resistance of the switch is maintained substantially constant by a circuit that modulates the clock signal driving the switch, thereby maintaining a substantially constant gate to source voltage of a transistor within the switch.

11. The sampling circuit of claim 1, wherein the second samplers and the third sampler comprise switch capacitor circuits.

12. The sampling circuit of claim 11, wherein the second samplers and the third sampler comprise switches, and the switches are connected to corresponding capacitors within the switch capacitor circuits.

13. The sampling circuit of claim 11, further comprising operational amplifiers, an operational amplifier corresponding with and receiving signals from each of the third samplers.

14. The sampling circuit of claim 13, further comprising feedback from an output of the operational amplifier to an input of the operational amplifier.

15. The sampling circuit of claim 13, wherein an ith operational amplifier receives signals from the ith third sampler, resulting in a total of N operational amplifiers.

16. The sampling circuit of claim 13, wherein each operational amplifier receives signals from two of the third samplers, wherein clocking signals of the two third samplers are approximately out-of-phase, resulting in a total of N/2 operational amplifiers.

17. The sampling circuit of claim 11, each of the second samplers comprising a capacitor that is charged during a first phase of an Fs/N sampling clock, and the third samplers transfer the charges of the capacitors to processing circuitry during a second phase of the Fs/N sampling clock.

18. A method of sampling a signal, comprising:
receiving an analog signal and generating first samples of the signal at a rate of Fs;
generating second samples from the first samples at a rate of Fs/N, the second samples having a relative phase of approximately (360/N)*(i−1) degrees, where i varies from 1 to N;
generating third samples from the second samples at a rate of Fs/N, and having a relative phase of approximately ((360/N)*(i−1)+180) degrees.

19. The method of claim 18, wherein the second samples are generated by second samplers, the first samples are generated by a first sampler, and at most one of the N second samplers are tracking an output of the first sampler at any point in time, and each one of the N second samplers track the output of the first sampler at some point in time.

20. The method of claim 18, wherein the second samples are generated by second samplers, the first samples are generated by a first sampler, and at most two of the N second samplers are tracking an output of the first sampler at any point in time, and each one of the N second samplers track the output of the first sampler at some point in time.

21. The method of sampling of claim 18, wherein the second samples and the third samples are time interleaved.

22. The method of sampling of claim 18, wherein the first samples are generated by tracking the analog signal during one phase of an Fs clock signal, and holding an output of a first sampler during another phase of the Fs clock signal.

23. The method of claim 18, wherein the second samples are generated by second samplers, the first samples are generated by a first sampler, further comprising a transition from tracking to holding of the second samplers which occurs during the holding of an output of the first sampler.

24. The method of sampling of claim 18, wherein the second samples and the third samples are generated by switch capacitor circuits.

25. The method of sampling of claim 18, wherein the third samples are generated by third samplers, and an operational amplifier receives signals from each of third samplers.

26. The method of sampling of claim 25, further comprising feeding back from an output of the operational amplifier to an input of the operational amplifier.

27. The method of sampling of claim 26, further comprising each operational amplifier receiving signals from two third samplers, wherein the two third samplers are clocked by clocking signal that are approximately out-of-phase, resulting in a total of N/2 operational amplifiers.

28. The method of sampling of claim 26, each of the second samplers comprises a capacitor that is charged during a first phase of an Fs/N sampling clock, and the third samplers transfers the charges of the second samplers to processing circuitry during a second phase of the Fs/N sampling clock.

29. A method of high-speed interleaved analog to digital converting comprising:
receiving an analog signal and generating first samples of the signal at a rate of Fs;
generating second samples from the first samples at a rate of Fs/N, the second samples having a relative phase of approximately (360/N)*(i−1) degrees, where i varies from 1 to N;
generating third samples from the second samples at a rate of Fs/N, and having a relative phase of approximately ((360/N)*(i−1)+180) degrees;
processing the third samples; and corresponding time interleaved ADCs receiving the processed third samples.

30. The method of claim 29, wherein the second samples are generated by second samplers, the first samples are generated by a first sampler, and at most one of the N second samplers are tracking an output of the first sampler at any point in time, and each one of the N second samplers track the output of the first sampler at some point in time.

31. The method of claim 29, wherein the second samples are generated by second samplers, the first samples are generated by a first sampler, and at most two of the N second samplers are tracking an output of the first sampler at any point in time, and each one of the N second samplers track the output of the first sampler at some point in time.

32. The method of claim 29, wherein the second samples are generated by second samplers, the first samples are generated by a first sampler, further comprising a transition from tracking to holding of the second samplers which occurs during the holding of an output of the first sampler.

33. The method of interleaved analog to digital converting of claim 29, wherein processing the third samples comprises buffering the third samples before the third samples are received by corresponding ADCs.

34. The method of interleaved analog to digital converting of claim 33, wherein the buffering comprises an operational amplifier with a feedback that includes a switched capacitor circuit.

35. The method of interleaved analog to digital converting of claim 29, wherein the first samples are generated by tracking the analog signal during one phase of an Fs clock signal, and holding the analog signal during another phase of the Fs clock signal.

36. The method of interleaved analog to digital converting of claim 29, wherein the second samples are generated by second samplers and the third samples are generated by third samplers, and the second and third samplers comprise switch capacitor circuits.

37. The method of interleaved analog to digital converting of claim 36, each of the second samplers comprises a capacitor that is charged during a first phase of an Fs/N sampling clock, and the third samplers transfers the charges of the second samplers to processing circuitry during a second phase of the Fs/N sampling clock.

38. The method of interleaved analog to digital converting of claim 29, wherein the third samples are generated by third samplers, and operational amplifiers receiving the third samples.

39. The method of interleaved analog to digital converting of claim 38, further comprising feeding back from an output of the operational amplifier to an input of the operational amplifier.

40. The method of interleaved analog to digital converting of claim 38, and an ith operational amplifier receiving signals from the ith third sampler during an on-phase period of an ith Fs/N frequency clock, resulting in a total of N operational amplifiers.

41. The method of interleaved analog to digital converting of claim 38, further comprising each operational amplifier receiving signals from two third samplers, wherein the two third samplers are clocked by clocking signal that are approximately out-of-phase, resulting in a total of N/2 operational amplifiers, and N/2 ADCs.

* * * * *